(12) United States Patent
Hashiya et al.

(10) Patent No.: US 9,899,577 B2
(45) Date of Patent: Feb. 20, 2018

(54) LIGHT-EMITTING APPARATUS INCLUDING PHOTOLUMINESCENT LAYER

(71) Applicant: Panasonic Intellectual Property Management Co., Ltd., Osaka (JP)

(72) Inventors: Akira Hashiya, Osaka (JP); Taku Hirasawa, Kyoto (JP); Yasuhisa Inada, Osaka (JP); Mikiko Matsuo, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/169,771

(22) Filed: Jun. 1, 2016

(65) Prior Publication Data

US 2016/0359091 A1 Dec. 8, 2016

(30) Foreign Application Priority Data

Jun. 8, 2015 (JP) ................. 2015-115782

(51) Int. Cl.
*H01L 33/10* (2010.01)
*H01L 33/50* (2010.01)
*H01L 33/44* (2010.01)

(52) U.S. Cl.
CPC ............ *H01L 33/508* (2013.01); *H01L 33/44* (2013.01)

(58) Field of Classification Search
None
See application file for complete search history.

(56) References Cited

U.S. PATENT DOCUMENTS

| 5,517,039 A | 5/1996 | Holonyak, Jr. et al. |
| 5,732,102 A | 3/1998 | Bouadma |
| 6,728,034 B1 | 4/2004 | Nakanishi et al. |
| 7,619,357 B2 | 11/2009 | Onishi et al. |
| 7,699,482 B2 | 4/2010 | Noguchi |
| 8,619,363 B1 | 12/2013 | Coleman |
| 2002/0180348 A1 | 12/2002 | Oda et al. |

(Continued)

FOREIGN PATENT DOCUMENTS

| JP | 9-073807 | 3/1997 |
| JP | 11-283751 | 10/1999 |

(Continued)

OTHER PUBLICATIONS

Non-final Office Action issued in U.S. Appl. No. 14/618,591, dated Nov. 9, 2015.

(Continued)

*Primary Examiner* — Ali Naraghi
(74) *Attorney, Agent, or Firm* — McDermott Will & Emery LLP

(57) ABSTRACT

A light-emitting apparatus comprising a photoluminescent layer that emits light in response to excitation light and has a light-emitting surface, the light from the photoluminescent layer being emitted through the light-emitting surface. The light-emitting surface includes a first region and a second region. The light from the photoluminescent layer includes first light having a wavelength $\lambda_a$ in air. The first light emitted through the first region has a smaller directional angle than the first light emitted through the second region.

14 Claims, 25 Drawing Sheets

(56) References Cited

U.S. PATENT DOCUMENTS

| | | |
|---|---|---|
| 2003/0021314 A1 | 1/2003 | Yoshida et al. |
| 2003/0169792 A1 | 9/2003 | Kim |
| 2004/0141108 A1 | 7/2004 | Tanaka et al. |
| 2004/0233534 A1 | 11/2004 | Nakanishi et al. |
| 2006/0039433 A1 | 2/2006 | Simpson |
| 2006/0088066 A1 | 4/2006 | He |
| 2007/0031097 A1 | 2/2007 | Heikenfeld et al. |
| 2007/0103931 A1 | 5/2007 | Lee et al. |
| 2007/0138479 A1 | 6/2007 | Yamazaki et al. |
| 2007/0153860 A1 | 7/2007 | Chang-Hasnain et al. |
| 2008/0069497 A1 | 3/2008 | Tissot et al. |
| 2008/0149916 A1 | 6/2008 | Baba et al. |
| 2008/0258160 A1 | 10/2008 | Do |
| 2008/0303419 A1* | 12/2008 | Fukuda ............... H01L 27/3246 313/504 |
| 2009/0021153 A1 | 1/2009 | Lee et al. |
| 2009/0040745 A1* | 2/2009 | Nemchuk ............ H01L 33/508 362/84 |
| 2009/0129115 A1 | 5/2009 | Fine et al. |
| 2009/0190068 A1 | 7/2009 | Kawamura |
| 2009/0206325 A1 | 8/2009 | Biwa et al. |
| 2009/0267092 A1 | 10/2009 | Fukshima et al. |
| 2009/0286337 A1 | 11/2009 | Lee et al. |
| 2010/0074284 A1 | 3/2010 | Aizawa et al. |
| 2010/0142189 A1 | 6/2010 | Hong et al. |
| 2010/0164365 A1 | 7/2010 | Yoshino et al. |
| 2010/0246210 A1 | 9/2010 | Yashiro |
| 2010/0277887 A1 | 11/2010 | Su et al. |
| 2011/0101359 A1 | 5/2011 | Kim et al. |
| 2011/0198645 A1 | 8/2011 | Jo et al. |
| 2012/0018705 A1 | 1/2012 | Takazoe et al. |
| 2012/0106127 A1 | 5/2012 | Hattori et al. |
| 2012/0119638 A1 | 5/2012 | Sato et al. |
| 2012/0176766 A1 | 7/2012 | Natsumeda |
| 2012/0224378 A1 | 9/2012 | Koike et al. |
| 2012/0286258 A1 | 11/2012 | Naraoka et al. |
| 2013/0069046 A1 | 3/2013 | Ishizuya |
| 2013/0181195 A1 | 7/2013 | Cho et al. |
| 2013/0208327 A1 | 8/2013 | Bolle et al. |
| 2013/0277703 A1 | 10/2013 | Matsuzaki |
| 2013/0308102 A1 | 11/2013 | Natsumeda et al. |
| 2014/0022818 A1 | 1/2014 | Natsumeda et al. |
| 2014/0071683 A1 | 3/2014 | Hamada et al. |
| 2014/0092620 A1 | 4/2014 | Tissot |
| 2014/0185316 A1 | 7/2014 | Kim et al. |
| 2014/0306176 A1 | 10/2014 | Chiu et al. |
| 2014/0362604 A1 | 12/2014 | Masuda |
| 2015/0249183 A1* | 9/2015 | Hirasawa ............... H05B 33/14 257/98 |
| 2015/0249186 A1 | 9/2015 | Inada et al. |
| 2015/0249187 A1 | 9/2015 | Inada et al. |
| 2016/0265746 A1 | 9/2016 | Hirasawa et al. |
| 2016/0265747 A1 | 9/2016 | Nagao et al. |
| 2016/0265749 A1 | 9/2016 | Inada |
| 2017/0012232 A1 | 1/2017 | Kataishi et al. |
| 2017/0075169 A1 | 3/2017 | Hayama |

FOREIGN PATENT DOCUMENTS

| | | |
|---|---|---|
| JP | 2001-059905 | 3/2001 |
| JP | 2001-155520 | 6/2001 |
| JP | 2007-103901 | 4/2007 |
| JP | 2007-240641 | 9/2007 |
| JP | 2008-130279 | 6/2008 |
| JP | 2008-521211 | 6/2008 |
| JP | 2008-227458 | 9/2008 |
| JP | 2009-140894 | 6/2009 |
| JP | 2010-015874 | 1/2010 |
| JP | 2010-033772 | 2/2010 |
| JP | 2010-097178 A | 4/2010 |
| JP | 2010-199357 | 9/2010 |
| JP | 2010-210824 | 9/2010 |
| JP | 2010-231941 | 10/2010 |
| JP | 2010-237311 A | 10/2010 |
| JP | 2011-166148 | 8/2011 |
| JP | 2012-093454 | 5/2012 |
| JP | 2012-109334 | 6/2012 |
| JP | 2012-109400 | 6/2012 |
| JP | 2012-182376 | 9/2012 |
| JP | 2013-183020 | 9/2013 |
| JP | 2014-075584 | 4/2014 |
| JP | 2014-082401 | 5/2014 |
| JP | 2014-092645 | 5/2014 |
| JP | 2014-523603 | 9/2014 |
| WO | 2007/034827 | 3/2007 |
| WO | 2007/091687 | 8/2007 |
| WO | 2009/005311 | 1/2009 |
| WO | 2009/099211 | 8/2009 |
| WO | 2011/040528 | 4/2011 |
| WO | 2012/049905 | 4/2012 |
| WO | 2012/108384 | 8/2012 |
| WO | 2012/137584 | 10/2012 |
| WO | 2013/084442 | 6/2013 |
| WO | 2013/125567 | 8/2013 |
| WO | 2013/172025 | 11/2013 |
| WO | 2014/024218 | 2/2014 |
| WO | 2014/119783 | 8/2014 |
| WO | 2015/045886 | 4/2015 |

OTHER PUBLICATIONS

Final Office Action issued in U.S. Appl. No. 14/618,591, dated May 19, 2016.
Non-final Office Action issued in U.S. Appl. No. 14/618,254, dated Feb. 3, 2016.
Non-Final Office Action issued in U.S. Appl. No. 14/621,729, dated Mar. 9, 2016.
Final Office Action issued in U.S. Appl. No. 14/621,729, dated Sep. 28, 2016.
International Search Report of PCT application No. PCT/JP2015/000810 dated Apr. 7, 2015.
International Search Report of PCT application No. PCT/JP2015/000811 dated Apr. 7, 2015.
International Search Report of PCT application No. PCT/JP2015/000812 dated Apr. 7, 2015.
International Search Report of PCT application No. PCT/JP2015/000813 dated May 19, 2015.
International Search Report of PCT application No. PCT/JP2015/000814 dated May 26, 2015.
International Search Report of PCT application No. PCT/JP2015/000815 dated Apr. 7, 2015.
International Search Report of PCT application No. PCT/JP2014/004324 dated Nov. 25, 2014; with English translation.
Specification of U.S. Appl. No. 15/166,123, filed May 26, 2016.
Specification of U.S. Appl. No. 15/206,273, filed Jul. 10, 2016.
Specification of U.S. Appl. No. 15/214,523, filed Jul. 20, 2016.
Specification of U.S. Appl. No. 15/214,803, filed Jul. 20, 2016.
Specification of U.S. Appl. No. 15/214,837, filed Jul. 20, 2016.
Specification of U.S. Appl. No. 15/215,592, filed Jul. 21, 2016.
Specification of U.S. Appl. No. 15/215,595, filed Jul. 21, 2016.
Specification of U.S. Appl. No. 15/215,599, filed Jul. 21, 2016.
Specification of U.S. Appl. No. 15/216,669, filed Jul. 21, 2016.
Specification of U.S. Appl. No. 15/216,686, filed Jul. 21, 2016.
Specification of U.S. Appl. No. 15/219,462, filed Jul. 26, 2016.
The Extended European Search Report dated Dec. 16, 2016 for the related European Patent Application No. 14883764.4.
Specification of U.S. Appl. No. 15/446,453, filed Mar. 1, 2017.
Non-Final Office Action issued in U.S. Appl. No. 15/216,669, dated Apr. 14, 2017.
Non-Final Office Action issued in U.S. Appl. No. 15/214,803, dated Aug. 8, 2017.
Non-Final Office Action issued in U.S. Appl. No. 15/214,837, dated Sep. 12, 2017.
Non-Final Office Action issued in U.S. Appl. No. 15/215,595, dated Jul. 28, 2017.
Notice of Allowance issued in U.S. Appl. No. 15/215,595, dated Sep. 22, 2017.

(56) References Cited

OTHER PUBLICATIONS

Non-Final Office Action issued in U.S. Appl. No. 15/215,599, dated Aug. 25, 2017.
Non-Final Office Action issued in U.S. Appl. No. 15/219,462, dated Sep. 26, 2017.

* cited by examiner

LIGHT-EMITTING APPARATUS INCLUDING PHOTOLUMINESCENT LAYER

BACKGROUND

1. Technical Field

The present disclosure relates to a light-emitting apparatus having a photoluminescent layer.

2. Description of the Related Art

Some optical devices, such as lighting fixtures, displays, and projectors, have high directionality, and others have low directionality. Photoluminescent materials, such as those used for fluorescent lamps and white light-emitting diodes (LEDs), emit light in all directions. Thus, these devices theoretically have low directionality or wide-angle light distribution characteristics. In various uses, however, light-emitting apparatuses are required to emit strong light in a desired direction or to have narrow-angle light distribution characteristics. In order to emit strong light in a particular direction, general light-emitting apparatuses include an optical component, such as a reflector or lens, together with a photoluminescent material. For example, Japanese Unexamined Patent Application Publication No. 2010-231941 discloses an illumination system including a light distributor and an auxiliary reflector to provide sufficient directionality.

SUMMARY

In one general aspect, the techniques disclosed here feature a light-emitting apparatus that includes a photoluminescent layer that emits light in response to excitation light and has a light-emitting surface, the light from the photoluminescent layer being emitted through the light-emitting surface. The light-emitting surface includes a first region and a second region. The light from the photoluminescent layer includes first light having a wavelength $\lambda_a$ in air. The first light emitted through the first region has a smaller directional angle than the first light emitted through the second region.

General or specific embodiments may be implemented as a device, an apparatus, a system, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1A:
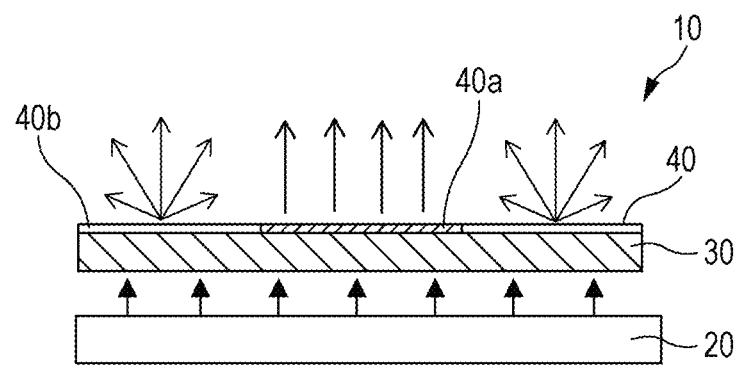
FIG. 1A is a schematic cross-sectional view of a light-emitting apparatus according to an embodiment of the present disclosure.

1. Outline of Embodiments of Present Disclosure

The present disclosure includes the following light-emitting apparatuses:

[Item 1]

A light-emitting apparatus including a photoluminescent layer for emitting light in response to excitation light, and a light-emitting surface on or above the photoluminescent layer, the light from the photoluminescent layer being emitted through the light-emitting surface, wherein the light-emitting surface includes a first region and a second region, the light from the photoluminescent layer includes first light having a wavelength $\lambda_a$ in air, and the first light emitted through the first region has a smaller directional angle than the first light emitted through the second region.

[Item 2]

The light-emitting apparatus according to Item 1, wherein the first region is a surface of a light-transmissive layer located on or near the photoluminescent layer.

[Item 3]

The light-emitting apparatus according to Item 2, wherein at least one of the photoluminescent layer and the light-transmissive layer has at least one periodic structure having projections or recesses or both, and the refractive index $n_{wav-a}$ of the photoluminescent layer for the first light and the period $p_a$ of the at least one periodic structure satisfy $\lambda_a/n_{wav-a} < p_a < \lambda_a$.

[Item 4]

The light-emitting apparatus according to Item 3, wherein the light-transmissive layer has the at least one periodic structure.

[Item 5]

The light-emitting apparatus according to Item 1, wherein the light-emitting surface is a surface of the photoluminescent layer.

[Item 6]

The light-emitting apparatus according to Item 5, wherein the photoluminescent layer has at least one periodic structure in the first region, the at least one periodic structure having projections or recesses or both, and the refractive index $n_{wav-a}$ of the photoluminescent layer for the first light and the period $p_a$ of the at least one periodic structure satisfy $\lambda_a/n_{wav-a} < p_a < \lambda_a$.

[Item 7]

The light-emitting apparatus according to Item 5, wherein a region opposite the first region on another surface of the photoluminescent layer opposite the surface has at least one periodic structure having projections or recesses or both, and the refractive index $n_{wav-a}$ of the photoluminescent layer for the first light and the period $p_a$ of the at least one periodic structure satisfy $\lambda_a/n_{wav-a} < p_a < \lambda_a$.

[Item 8]

The light-emitting apparatus according to any one of Items 1 to 7, wherein at least part of the second region is disposed at an end of the light-emitting surface.

[Item 9]

The light-emitting apparatus according to any one of Items 1 to 8, wherein the second region surrounds the first region.

[Item 10]

The light-emitting apparatus according to any one of Items 1 to 9, wherein the first region has a larger area than the second region.

[Item 11]

The light-emitting apparatus according to any one of Items 1 to 10, wherein the second region has a larger area than the first region.

[Item 12]

A light-emitting apparatus including a first light-emitting layer including a first photoluminescent layer, the first photoluminescent layer emitting light in response to excitation light, and a second light-emitting layer that is disposed on or above at least part of the first light-emitting layer and includes a second photoluminescent layer, the second photoluminescent layer emitting light in response to the excitation light passing through the first light-emitting layer, wherein the light from the first and second photoluminescent layers includes first light having a wavelength $\lambda_a$ in air, one of the first and second light-emitting layers has at least one periodic structure extending along a plane parallel to the first or second photoluminescent layer, and the at least one periodic structure has projections or recesses or both, the refractive index $n_{wav-a}$ of the photoluminescent layer in one of the first and second light-emitting layers for the first light and the period $p_a$ of the at least one periodic structure satisfy $\lambda_a/n_{wav-a} < p_a < \lambda_a$, and the first light emitted through a surface of one of the first and second light-emitting layers has a smaller directional angle than the first light emitted through a surface of the other light-emitting layer.

[Item 13]

The light-emitting apparatus according to Item 12, wherein the one of the first and second light-emitting layers includes a light-transmissive layer located on or near the photoluminescent layer in the one of the first and second light-emitting layers, and at least one of the photoluminescent layer and the light-transmissive layer has the at least one periodic structure.

[Item 14]

The light-emitting apparatus according to Item 12, wherein the photoluminescent layer in the one of the first and second light-emitting layers has the at least one periodic structure.

[Item 15]

The light-emitting apparatus according to Item 12, wherein the second light-emitting layer has the at least one periodic structure, and the first light emitted through a surface of the second light-emitting layer has a smaller directional angle than the first light emitted through a surface of the first light-emitting layer.

[Item 16]

The light-emitting apparatus according to Item 2, 3, 4, or 13, wherein the photoluminescent layer is in direct contact with the light-transmissive layer.

[Item 17]

The light-emitting apparatus according to any one of Items 1 to 16, further including an excitation light source that emits the excitation light.

Hitherto, there has been no light-emitting apparatus that has both a light-emitting region having a relatively small directional angle (a narrow-angle light distribution) and a light-emitting region having a relatively large directional angle (a wide-angle light distribution). Such a light-emitting apparatus can be produced only by combining an existing light source having a wide-angle light distribution with a light source having a narrow-angle light distribution including an optical component, such as a reflector or lens. However, such a simple combination of two light sources involves independent production of each light source and coupling of the light sources, thus increasing the number of production processes.

The present inventors noticed these problems and diligently studied a structure in which one light-emitting device includes both a light-emitting region having a narrow-angle light distribution and a light-emitting region having a wide-angle light distribution. The present inventors found that a light-emitting apparatus that has narrow-angle light distribution and wide-angle light distribution characteristics can be easily produced by employing a structure as described in the following embodiments.

FIG. 1A is a schematic cross-sectional view of a light-emitting apparatus 10 according to an embodiment of the present disclosure. The light-emitting apparatus 10 includes an excitation light source 20, which emits excitation light, a photoluminescent layer 30, which emits light in response to the excitation light, and a light-emitting surface 40 disposed on the photoluminescent layer 30. Light from the photoluminescent layer 30 is emitted through the light-emitting surface 40. The light-emitting surface 40 includes a first region 40a and a second region 40b. Light from the photoluminescent layer 30 includes first light having a wavelength $\lambda_a$ in air. The wavelength $\lambda_a$ may be in the visible wavelength range. Typically, light from the photoluminescent layer 30 may have as wide a wavelength range as white light. The first light emitted through the first region 40a has a smaller directional angle than the first light emitted through the second region 40b. The term "directional angle", as used herein, refers to the angle between the direction of maximum intensity of light emitted through a light-emitting surface and the direction of 50% of the maximum intensity. The first region 40a may also be referred to as a "narrow-angle light distribution region 40a", and the second region 40b may also be referred to as a "wide-angle light distribution region 40b".

In the embodiment illustrated in FIG. 1A, the light-emitting surface 40 is a surface of the photoluminescent layer 30. Although an interface between the light-emitting surface 40 and the photoluminescent layer 30 is illustrated in FIG. 1A, there is practically no interface.

Figure 1B:
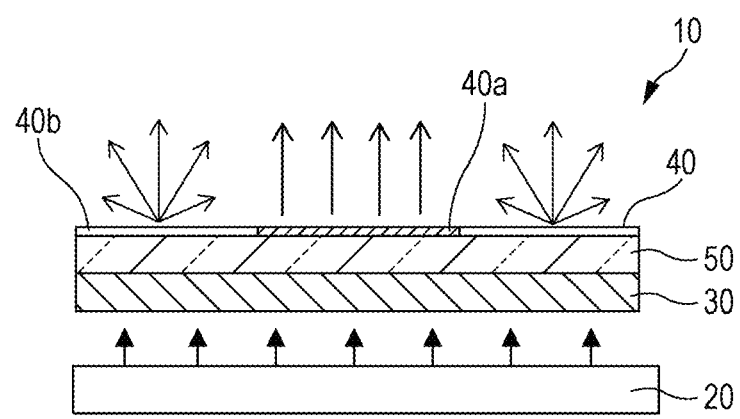
FIG. 1B is a schematic cross-sectional view of a light-emitting apparatus according to another embodiment.

FIG. 1B is a schematic cross-sectional view of a light-emitting apparatus 10 according to another embodiment. This light-emitting apparatus 10 further includes a light-transmissive layer 50 on the photoluminescent layer 30. In this embodiment, the light-emitting surface 40 is a surface of the light-transmissive layer 50. Although an interface between the light-emitting surface 40 and the light-transmissive layer 50 is illustrated in FIG. 1B, there is practically no interface.

The first region 40a on the light-emitting surface 40 may have a novel structure found by the present inventors (hereinafter referred to as a submicron structure or a periodic structure). This structure includes at least one periodic structure extending along a plane parallel to the light-emitting surface and will be described in detail later. The refractive index $n_{wav-a}$ of the photoluminescent layer 30 for the first light and the period $p_a$ of the periodic structure satisfy $\lambda_a/n_{wav-a}<p_a<\lambda_a$. As described later, directional light can be emitted under this condition.

The periodic structure is not necessarily disposed in the first region 40a and may be disposed in a region between the first region 40a and the excitation light source 20. The periodic structure may be opposite the first region 40a on a surface of the photoluminescent layer 30 or the light-transmissive layer 50 opposite the light-emitting surface 40.

The second region 40b does not have such a periodic structure. The second region 40b may be a surface of a light-transmitting cover, such as a glass cover or a synthetic resin cover, or a surface of a diffuser that scatters light.

Figure 2A:
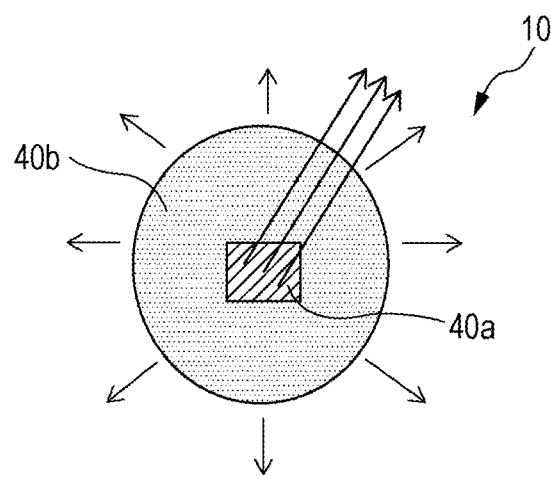
FIG. 2A is a plan view illustrating an arrangement of a narrow-angle light distribution region and a wide-angle light distribution region on a light-emitting surface of a light-emitting apparatus.
Figure 2B:
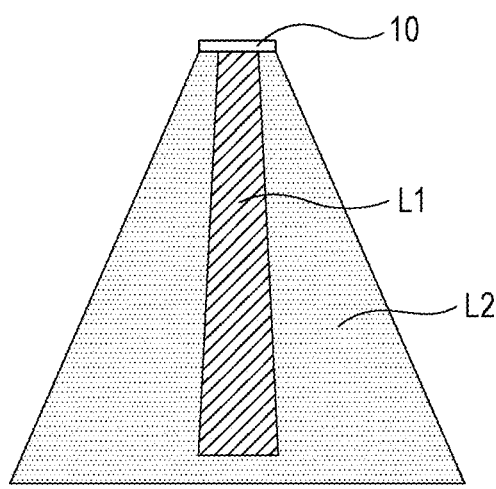
FIG. 2B is a schematic view illustrating the light distribution characteristics of light emitted from a light-emitting apparatus.

FIG. 2A is a plan view illustrating an arrangement of a narrow-angle light distribution region 40a and a wide-angle light distribution region 40b on a light-emitting surface of a light-emitting apparatus 10. FIG. 2B is a schematic view illustrating the light distribution characteristics of light emitted from a light-emitting apparatus 10. In this embodiment, the first region 40a is disposed near the center of the light-emitting surface and is surrounded by the second region 40b. Light L1 having a narrow-angle light distribution is emitted through the first region 40a of the light-emitting surface. Light L2 having a wide-angle light distribution is emitted through the second region 40b. Such a structure can illuminate a wide area and irradiate a particular area with stronger light.

Figure 3A:
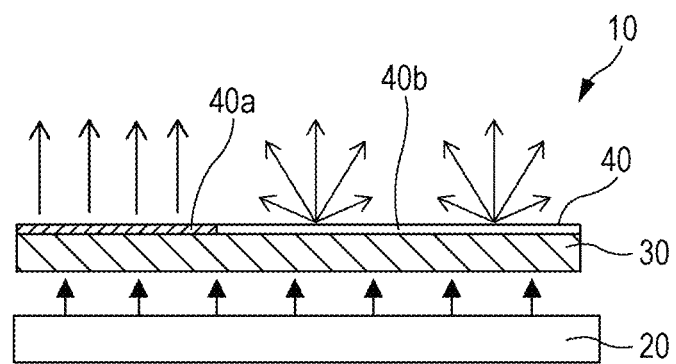
FIG. 3A is a schematic view of a light-emitting apparatus according to another modified example.
Figure 3B:
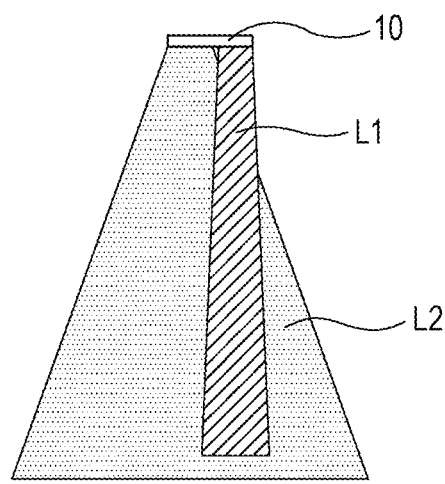
FIG. 3B is a schematic view illustrating another example of the light distribution characteristics of light emitted from a light-emitting apparatus.

FIGS. 3A and 3B illustrate a light-emitting apparatus 10 according to another modified example. In this light-emitting apparatus 10, the second region 40b is disposed at an end of the light-emitting surface 40. Like this, at least part of the second region 40b may be disposed at an end of the light-emitting surface 40. Such a structure can illuminate the entire room and irradiate a corner of the room with stronger light.

Figure 4:
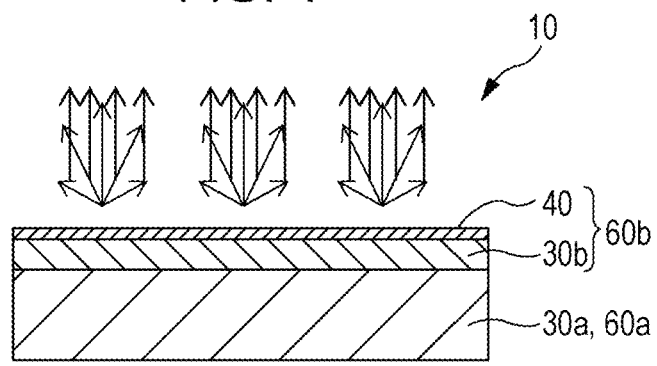
FIG. 4 is a schematic view of a light-emitting apparatus according to still another modified example.

FIG. 4 illustrates a light-emitting apparatus 10 according to still another modified example. This light-emitting apparatus 10 includes a first light-emitting layer 60a having a wide-angle light distribution and a second light-emitting layer 60b having a narrow-angle light distribution disposed on the first light-emitting layer 60a. The first light-emitting layer 60a includes a first photoluminescent layer 30a. The second light-emitting layer 60b includes a second photoluminescent layer 30b and a light-emitting surface 40. Although the light-emitting surface 40 is a surface of the photoluminescent layer 30b, the light-emitting surface 40 may be a surface of a light-transmissive layer. The photoluminescent layers 30a and 30b may be formed of the same material or different materials.

Light from the photoluminescent layers 30a and 30b includes first light having a wavelength $\lambda_a$ in air. The light-emitting surface 40 of the second light-emitting layer 60b has at least one periodic structure extending along a plane parallel to the photoluminescent layer 30b. The refractive index $n_{wav-a}$ of the photoluminescent layer 30b for the first light and the period $p_a$ of the at least one periodic structure satisfy $\lambda_a/n_{wav-a}<p_a<\lambda_a$. Consequently, the first light emitted through the light-emitting surface 40 has a smaller directional angle than the first light emitted through a surface of the first light-emitting layer 60a (a surface in contact with the photoluminescent layer 30b).

Although the second light-emitting layer 60b has a periodic structure, the first light-emitting layer 60a may have a periodic structure. In such a case, the photoluminescent layer 30a or a light-transmissive layer (not shown) in the first light-emitting layer 60a may have a periodic structure.

Figure 5:
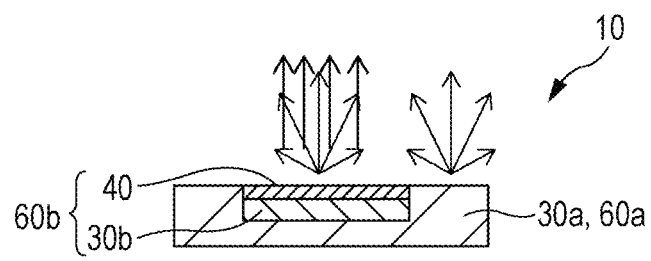
FIG. 5 is a schematic view of a light-emitting apparatus according to still another modified example.

FIG. 5 illustrates a light-emitting apparatus 10 according to still another modified example. In this light-emitting apparatus 10, a light-emitting layer (light-emitting region) 60b having a narrow-angle light distribution is disposed on part of a light-emitting layer (light-emitting region) 60a having a wide-angle light distribution. Like this, a light-emitting region having a narrow-angle light distribution may be buried in a light-emitting region having a wide-angle light distribution.

As in the embodiments illustrated in FIGS. 4 and 5, a light-emitting region having a narrow-angle light distribution and a light-emitting region having a wide-angle light distribution can be formed (stacked) on different surfaces to decrease the size of the apparatus.

In these embodiments, the arrangement, shape, and size of the narrow-angle light distribution region and the wide-angle light distribution region can depend on the intended use. A light-emitting apparatus may include a driving mechanism, such as a wheel or motor, for changing the position of a narrow-angle light distribution region and/or a control mechanism for changing the position, brightness, and color of a narrow-angle light distribution region in accordance with the operation of a remote controller.

Figure 6:
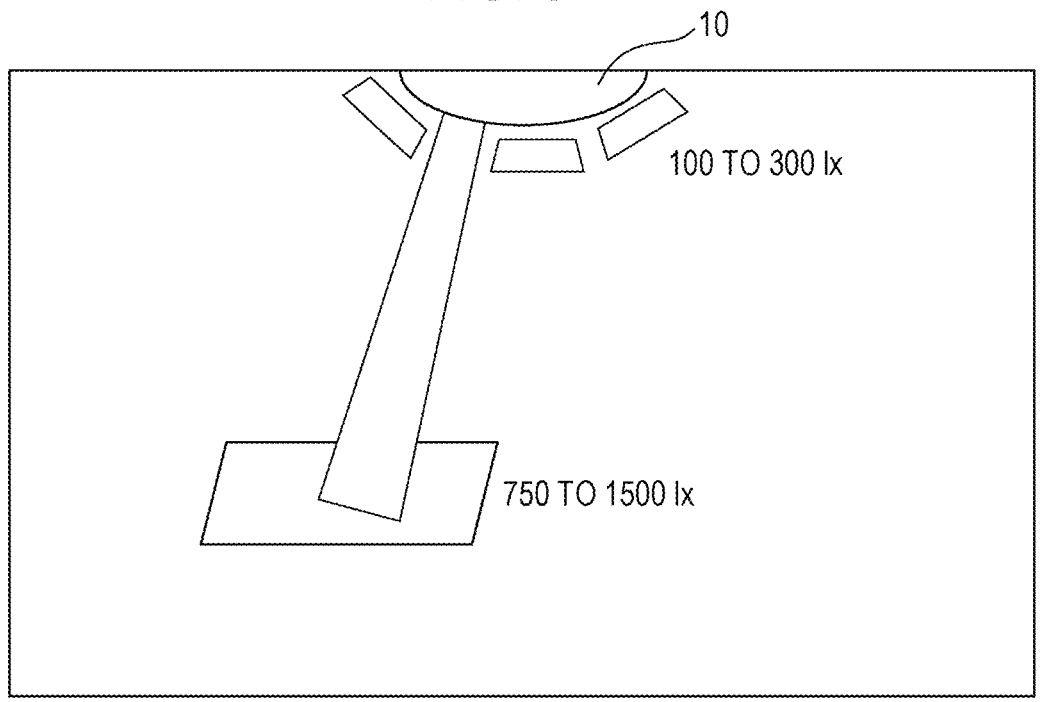
FIG. 6 is an explanatory view of the volume ratio of a narrow-angle light distribution region to a wide-angle light distribution region in a light-emitting apparatus.

FIG. 6 is an explanatory view of the volume ratio of a narrow-angle light distribution region to a wide-angle light distribution region in a light-emitting apparatus 10. The luminous flux for room illumination ranges from approximately 4000 to 5000 lm for an approximately 16-m$^2$ room, for example. The luminous flux for operations ranges from approximately 750 to 1500 lm for a 1-m$^2$ workspace, for example. In this embodiment, a luminous flux having a wide-angle light distribution needs to be higher than a luminous flux having a narrow-angle light distribution, and therefore the volume of a wide-angle light distribution region is designed to be greater than the volume of a narrow-angle light distribution region. In this embodiment, the volume of the narrow-angle light distribution region to the volume of the wide-angle light distribution region may range from 1/5 to 1/2.

Figure 7:
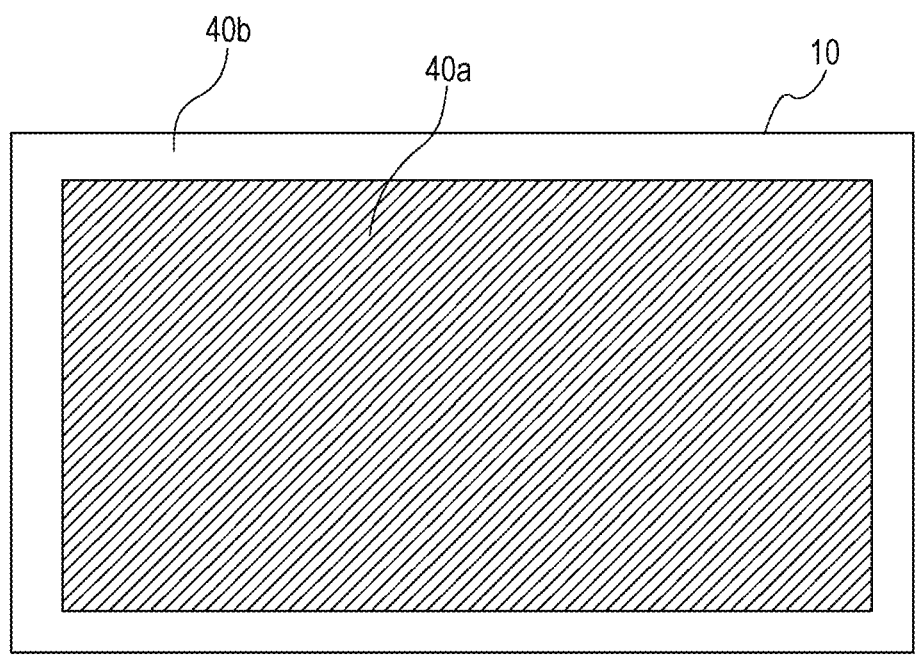
FIG. 7 is a plan view of a light-emitting apparatus having a larger narrow-angle light distribution region than a wide-angle light distribution region.

The narrow-angle light distribution region may be designed to be larger than the wide-angle light distribution region. FIG. 7 is a plan view of a light-emitting apparatus 10 thus designed. This light-emitting apparatus 10 has the structure illustrated in FIG. 1A or 1B except that the narrow-angle light distribution region 40a is much larger than the wide-angle light distribution region 40b. In this embodiment, the area of the narrow-angle light distribution region 40a accounts for 80% or more of the area of the light-emitting surface. Such a structure can be used in applications that mainly utilize directional light. The wide-angle light distribution region 40b may be a glass or synthetic resin frame (casing) surrounding the narrow-angle light distribution region 40a. In applications that mainly utilize directional light, the wide-angle light distribution region 40b may function as a casing rather than a light-emitting region. More specifically, the wide-angle light distribution region 40b may function as a grip when the light-emitting apparatus 10 is attached to a supporting portion of a housing. The light-emitting apparatus 10 can be easily attached to a supporting portion without damaging the narrow-angle light distribution region 40a by grasping the wide-angle light distribution region 40b. Although the light-emitting apparatus 10 includes an excitation light source in these embodiments, the excitation light source may be disposed outside the light-emitting apparatus 10. Apparatuses for narrow-angle light distributions are not limited to apparatuses having periodic structures. In apparatuses in which one photoluminescent layer is combined with multiple light-emitting regions, as illustrated in FIGS. 1A and 1B, the apparatuses are designed to emit different directional light beams through the multiple light-emitting regions. For example, a light source, such as an existing LED having relatively high directionality, may be disposed in the first region 40a, and a light diffuser may be disposed in the second region 40b.

A periodic structure for a narrow-angle light distribution will be described in detail below. The periodic structure is not necessarily a completely periodic structure and may be a partly periodic structure. The periodic structure may be a combination of periodic structures. A periodic structure having a submicron period is referred to as a "submicron structure". Light-emitting devices for a narrow-angle light distribution may have various structures as described below.

A light-emitting device according to an embodiment of the present disclosure includes a photoluminescent layer, a light-transmissive layer located on or near the photoluminescent layer, and a submicron structure that is formed on at least one of the photoluminescent layer and the light-transmissive layer and that extends in a plane of the photoluminescent layer or the light-transmissive layer. The submicron structure has projections or recesses. Light from the photoluminescent layer includes first light having a wavelength $\lambda_a$ in air. The distance $D_{int}$ between adjacent projections or recesses and the refractive index $n_{wav-a}$ of the photoluminescent layer for the first light satisfy $\lambda_a/n_{wav-a} < D_{int} < \lambda_a$. The wavelength $\lambda_a$ may be within the visible wavelength range (for example, 380 to 780 nm). When infrared light is used, the wavelength $\lambda_a$ may be more than 780 nm. The term "light", as used herein, refers to light in general, including infrared light.

The photoluminescent layer contains a photoluminescent material. The term "photoluminescent material" refers to a material that emits light in response to excitation light. The term "photoluminescent material" encompasses fluorescent materials and phosphorescent materials in a narrow sense, encompasses inorganic materials and organic materials (for example, dyes), and encompasses quantum dots (that is, tiny semiconductor particles). The photoluminescent layer may contain a matrix material (host material) in addition to the photoluminescent material. Examples of matrix materials include resins and inorganic materials, such as glasses and oxides.

The light-transmissive layer located on or near the photoluminescent layer is formed of a material, for example, an inorganic material or resin, having high transmittance to light emitted from the photoluminescent layer. For example, the light-transmissive layer is formed of a dielectric material (particularly, an insulator having low light absorptivity). The light-transmissive layer may also be a substrate that supports the photoluminescent layer. If the surface of the photoluminescent layer facing air has a submicron structure, an air layer can serve as the light-transmissive layer.

In a light-emitting device according to an embodiment of the present disclosure, a submicron structure (for example, a periodic structure) on at least one of the photoluminescent layer and the light-transmissive layer forms a unique electric field distribution inside the photoluminescent layer and the light-transmissive layer, as described in detail later with reference to the results of calculations and experiments. This electric field distribution is formed by an interaction between guided light and a submicron structure and may also be referred to as a "quasi-guided mode". The quasi-guided mode can be utilized to improve the luminous efficiency, directionality, and polarization selectivity of photoluminescence, as described later. The term "quasi-guided mode" may be used in the following description to describe novel structures and/or mechanisms contemplated by the inventors. The following description is for illustrative purposes only and is not intended to limit the present disclosure in any way.

The submicron structure has projections or recesses or both. The distance (center-to-center distance) $D_{int}$ between adjacent projections or recesses satisfies $\lambda_a/n_{wav-a} < D_{int} < \lambda_a$. The symbol X denotes the wavelength of light, and the symbol $\lambda_a$ denotes the wavelength of light in air. The symbol $n_{wav}$ denotes the refractive index of the photoluminescent layer. If the photoluminescent layer is a medium containing a mixture of materials, the refractive index $n_{wav}$ denotes the average refractive index of the materials weighted by their respective volume fractions. Although it is desirable to use the symbol $n_{wav-a}$ to refer to the refractive index for light having a wavelength $\lambda_a$ because the refractive index n generally depends on the wavelength, it may be abbreviated for simplicity. The symbol $n_{wav}$ basically denotes the refractive index of the photoluminescent layer. However, if a layer adjacent to the photoluminescent layer has a higher refractive index than the photoluminescent layer, $n_{wav}$ denotes the average of the refractive index of the layer having the higher refractive index and the refractive index of the photoluminescent layer weighted by their respective volume fractions. This situation is optically equivalent to a photoluminescent layer composed of layers of different materials.

The effective refractive index $n_{eff}$ of the medium for light in the quasi-guided mode satisfies $n_a < n_{eff} < n_{wav}$, wherein $n_a$ denotes the refractive index of air. If light in the quasi-guided mode propagates through the photoluminescent layer while being totally reflected at an incident angle θ, the effective refractive index $n_{eff}$ can be written as $n_{eff}=n_{wav} \sin \theta$. The effective refractive index $n_{eff}$ is determined by the refractive index of the medium present in the region where the electric field of the quasi-guided mode is distributed. For example, if the submicron structure is formed in the light-transmissive layer, the effective refractive index $n_{eff}$ depends not only on the refractive index of the photoluminescent layer but also on the refractive index of the light-transmissive layer. Because the electric field distribution also varies with the polarization direction of the quasi-guided mode (TE mode or TM mode), the effective refractive index $n_{eff}$ can differ between the TE mode and the TM mode.

The submicron structure is formed on at least one of the photoluminescent layer and the light-transmissive layer. If the photoluminescent layer and the light-transmissive layer are in contact with each other, the submicron structure may be formed at the interface between the photoluminescent layer and the light-transmissive layer. In such a case, the photoluminescent layer and the light-transmissive layer have the submicron structure. The photoluminescent layer may have no submicron structure. In such a case, a light-transmissive layer having a submicron structure is located on or near the photoluminescent layer. A phrase like "a light-transmissive layer (or its submicron structure) located on or near the photoluminescent layer", as used herein, typically means that the distance between these layers is less than half the wavelength $\lambda_a$. This allows the electric field in a guided mode to reach the submicron structure, thus forming a quasi-guided mode. However, the distance between the submicron structure of the light-transmissive layer and the photoluminescent layer may exceed half the wavelength $\lambda_a$ if the light-transmissive layer has a higher refractive index than the photoluminescent layer, because light reaches the light-transmissive layer even if the above relationship is not satisfied. In the present specification, if the photoluminescent layer and the light-transmissive layer have a positional relationship that allows the electric field in a guided mode to reach the submicron structure and form a quasi-guided mode, they may be associated with each other.

The submicron structure, which satisfies $\lambda_a/n_{wav-a} < D_{int} < \lambda_a$, as described above, is characterized by the submicron size. The submicron structure includes at least one periodic structure, as in the light-emitting devices according to the embodiments described in detail later. The at least one periodic structure has a period $p_a$ that satisfies $\lambda_a/n_{wav-a} < p_a < \lambda_a$. Thus, the submicron structure includes a periodic structure in which the distance $D_{int}$ between adjacent projections is constant at $p_a$. If the submicron structure includes a periodic structure, light in the quasi-guided mode propagates while repeatedly interacting with the periodic structure so that the light is diffracted by the submicron structure. Unlike the phenomenon in which light propagating through free space is diffracted by a periodic structure, this is the phenomenon in which light is guided (that is, repeatedly totally reflected) while interacting with the periodic structure. This can efficiently diffract light even if the periodic structure causes a small phase shift (that is, even if the periodic structure has a small height).

The above mechanism can be utilized to improve the luminous efficiency of photoluminescence by the enhancement of the electric field due to the quasi-guided mode and also to couple emitted light into the quasi-guided mode. The angle of travel of light in the quasi-guided mode is changed by the angle of diffraction determined by the periodic structure. This can be utilized to emit light of a particular wavelength in a particular direction (significantly improve the directionality). Furthermore, high polarization selectivity can be simultaneously achieved because the effective refractive index $n_{eff}$ ($=n_{wav} \sin \theta$) differs between the TE mode and the TM mode. For example, as demonstrated by the experimental examples below, a light-emitting device can be provided that emits intense linearly polarized light (for example, the TM mode) having a particular wavelength (for example, 610 nm) in the front direction. The directional angle of light emitted in the front direction is less than 15 degrees, for example.

Conversely, a submicron structure having lower periodicity results in lower directionality, luminous efficiency, polarization, and wavelength selectivity. The periodicity of the submicron structure may be adjusted depending on the need. The periodic structure may be a one-dimensional periodic structure, which has higher polarization selectivity, or a two-dimensional periodic structure, which allows for lower polarization.

The submicron structure may include periodic structures. These periodic structures may have different periods or different periodic directions (axes). The periodic structures may be formed on the same plane or different planes. The light-emitting device may include photoluminescent layers and light-transmissive layers, and each of the layers may have submicron structures.

The submicron structure can be used not only to control light emitted from the photoluminescent layer but also to efficiently guide excitation light into the photoluminescent layer. That is, excitation light can be diffracted by the submicron structure and coupled into the quasi-guided mode that guides light in the photoluminescent layer and the light-transmissive layer and thereby can efficiently excite the photoluminescent layer. The submicron structure satisfies $\lambda_{ex}/n_{wav-ex} < D_{int} < \lambda_{ex}$, wherein $\lambda_{ex}$ denotes the wavelength of excitation light in air, the excitation light exciting the photoluminescent material, and $n_{wav-ex}$ denotes the refractive index of the photoluminescent layer for the excitation light. The symbol $n_{wav-ex}$ denotes the refractive index of the photoluminescent layer at the emission wavelength of the photoluminescent material. Alternatively, the submicron structure may include a periodic structure having a period $p_{ex}$ that satisfies $\lambda_{ex}/n_{wav-ex} < p_{ex} < \lambda_{ex}$. The excitation light has a wavelength $\lambda_{ex}$ of 450 nm, for example, but may have a shorter wavelength than visible light. If the excitation light has a wavelength in the visible range, the excitation light may be emitted together with light emitted from the photoluminescent layer.

2. Underlying Knowledge Forming Basis of the Present Disclosure

The underlying knowledge forming the basis for the present disclosure will be described below. As described above, photoluminescent materials, such as those used for fluorescent lamps and white LEDs, emit light in all directions and thus require an optical element, such as a reflector or lens, to emit light in a particular direction. These optical elements, however, can be eliminated (or the size thereof can be reduced) if the photoluminescent layer itself emits directional light. This results in a significant reduction in the size of optical devices and equipment. With this idea in mind, the inventors have conducted a detailed study on the photoluminescent layer to achieve directional light emission.

The inventors have investigated the possibility of inducing light emission with particular directionality so that light from the photoluminescent layer is localized in a particular direction. Based on Fermi's golden rule, the emission rate Γ, which is a measure characterizing light emission, is represented by the formula (1):

$$\Gamma(r) = \frac{2\pi}{\hbar} \langle (d \cdot E(r)) \rangle^2 \rho(\lambda) \quad (1)$$

In the formula (1), r denotes the vector indicating the position, λ denotes the wavelength of light, d denotes the dipole vector, E denotes the electric field vector, and ρ denotes the density of states. In many substances other than some crystalline substances, the dipole vector d is randomly oriented. The magnitude of the electric field E is substantially constant irrespective of the direction if the size and thickness of the photoluminescent layer are sufficiently larger than the wavelength of light. Hence, in most cases, the value of $\langle (d \cdot E(r)) \rangle^2$ is independent of the direction. Accordingly, the emission rate F is constant irrespective of the direction. Thus, in most cases, the photoluminescent layer emits light in all directions.

As can be seen from the formula (1), to achieve anisotropic light emission, it is necessary to align the dipole vector d in a particular direction or to enhance a component of the electric field vector in a particular direction. One of these approaches can be employed to achieve directional light emission. In the present disclosure, the results of a detailed study and analysis on structures for utilizing a quasi-guided mode in which an electric field component in a particular direction is enhanced by the confinement of light in the photoluminescent layer will be described below.

The inventors have investigated the possibility of controlling light emission using a guided mode with an intense electric field. Light can be coupled into a guided mode using a waveguide structure that itself contains a photoluminescent material. However, a waveguide structure simply formed using a photoluminescent material emits little or no light in the front direction because the emitted light is coupled into a guided mode. Accordingly, the inventors have investigated the possibility of combining a waveguide containing a photoluminescent material with a periodic structure (including projections or recesses or both). When the electric field of light is guided in a waveguide while overlapping with a periodic structure located on or near the waveguide, a quasi-guided mode is formed by the effect of the periodic structure. That is, the quasi-guided mode is a guided mode restricted by the periodic structure and is characterized in that the antinodes of the amplitude of the electric field have the same period as the periodic structure. Light in this mode is confined in the waveguide structure to enhance the electric field in a particular direction. This mode also interacts with the periodic structure and undergoes diffraction, so that light in this mode is converted into light propagating in a particular direction and can be emitted from the waveguide. The electric field of light other than the quasi-guided mode is not enhanced because little or no such light is confined in the waveguide. Thus, most light is coupled into a quasi-guided mode with a large electric field component.

That is, the inventors have investigated the possibility of using a photoluminescent layer containing a photoluminescent material as a waveguide (or a waveguide layer including a photoluminescent layer) in combination with a periodic structure located on or near the waveguide to couple light into a quasi-guided mode in which the light is converted into light propagating in a particular direction, thereby providing a directional light source.

Figure 37:
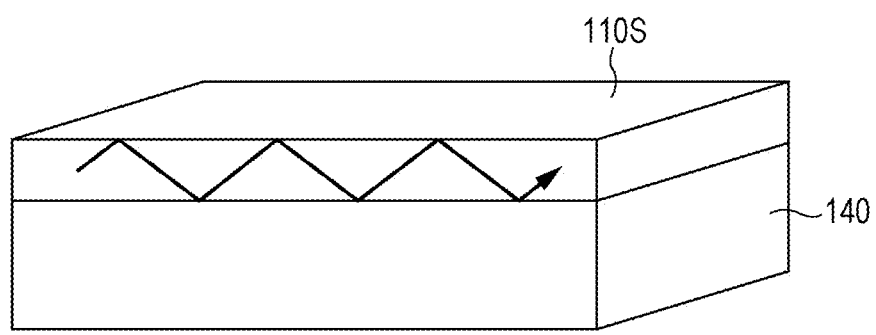
FIG. 37 is a schematic perspective view of a slab waveguide.

As a simple waveguide structure, the inventors have studied slab waveguides. A slab waveguide has a planar structure in which light is guided. FIG. 37 is a schematic perspective view of a slab waveguide 110S. There is a mode of light propagating through the waveguide 110S if the waveguide 110S has a higher refractive index than a transparent substrate 140 that supports the waveguide 110S. If such a slab waveguide includes a photoluminescent layer, the electric field of light emitted from an emission point overlaps largely with the electric field of a guided mode. This allows most of the light emitted from the photoluminescent layer to be coupled into the guided mode. If the photoluminescent layer has a thickness close to the wavelength of light, a situation can be created where there is only a guided mode with a large electric field amplitude.

If a periodic structure is located on or near the photoluminescent layer, the electric field of the guided mode interacts with the periodic structure to form a quasi-guided mode. Even if the photoluminescent layer is composed of multiple layers, a quasi-guided mode is formed as long as the electric field of the guided mode reaches the periodic structure. Not all parts of the photoluminescent layer needs to be formed of a photoluminescent material, provided that at least a portion of the photoluminescent layer functions to emit light.

If the periodic structure is formed of a metal, a mode due to the guided mode and plasmon resonance is formed. This mode has different properties from the quasi-guided mode. This mode is less effective in enhancing emission because a large loss occurs due to high absorption by the metal. Thus, it is desirable to form the periodic structure using a dielectric material having low absorptivity.

Figure 8A:
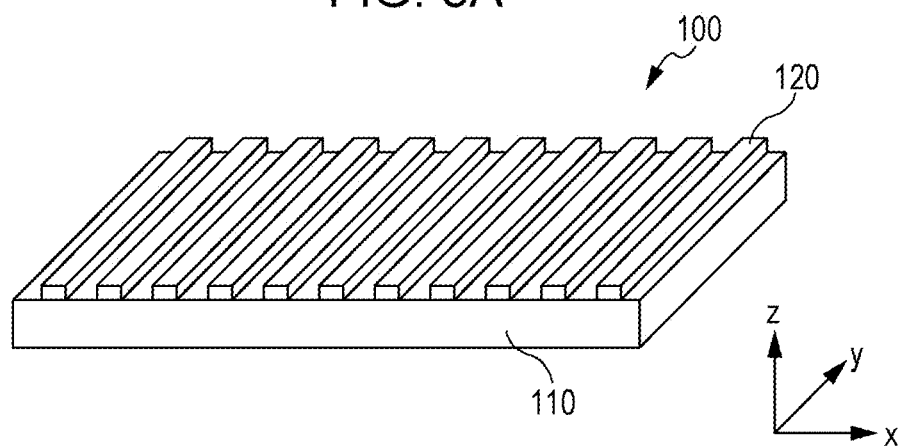
FIG. 8A is a perspective view of the structure of a light-emitting device according to an embodiment.
Figure 8B:
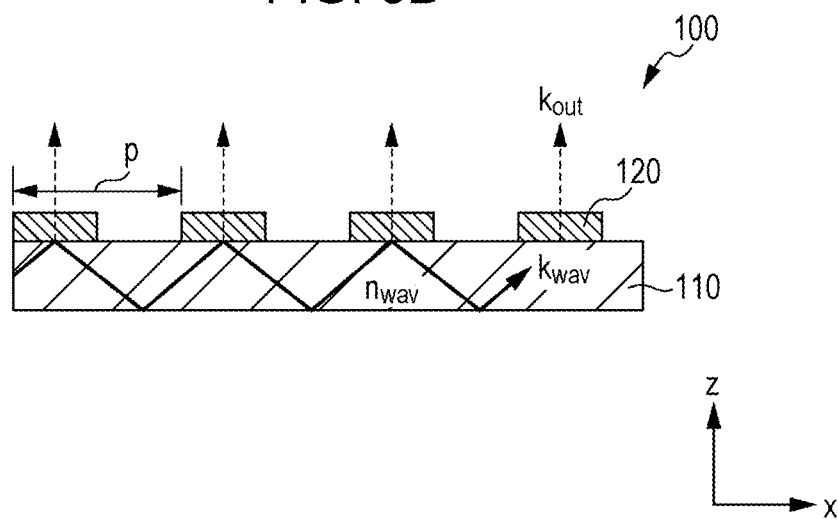
FIG. 8B is a fragmentary cross-sectional view of the light-emitting device illustrated in FIG. 8A.

The inventors have studied the coupling of light into a quasi-guided mode that can be output as light propagating in a particular angular direction using a periodic structure formed on a waveguide (for example, a photoluminescent layer). FIG. 8A is a schematic perspective view of a light-emitting device 100 including a waveguide (for example, a photoluminescent layer) 110 and a periodic structure (for example, a light-transmissive layer) 120. The structure in FIG. 8A corresponds to the narrow-angle light distribution region 40a illustrated in FIG. 1A to FIG. 7. The same applies to the subsequent figures including a periodic structure. The light-transmissive layer 120 is hereinafter also referred to as a periodic structure 120 if the light-transmissive layer 120 forms a periodic structure (that is, if a periodic submicron structure is formed on the light-transmissive layer 120). In this example, the periodic structure 120 is a one-dimensional periodic structure in which stripe-shaped projections extending in the y direction are arranged at regular intervals in the x direction. FIG. 8B is a cross-sectional view of the light-emitting device 100 taken along a plane parallel to the xz plane. If a periodic structure 120 having a period p is provided in contact with the waveguide 110, a quasi-guided mode having a wave number $k_{wav}$ in the in-plane direction is converted into light propagating outside the waveguide 110. The wave number $k_{out}$ of the light can be represented by the formula (2):

$$k_{out} = k_{wav} - m\frac{2\pi}{p} \quad (2)$$

wherein m is an integer indicating the diffraction order.

For simplicity, light guided in the waveguide 110 is assumed to be a ray of light propagating at an angle $\theta_{wav}$. This approximation gives the formulae (3) and (4):

$$\frac{k_{wav}\lambda_0}{2\pi} = n_{wav} \sin \theta_{wav} \quad (3)$$

$$\frac{k_{out}\lambda_0}{2\pi} = n_{out} \sin \theta_{out} \quad (4)$$

In these formulae, $\lambda_0$ denotes the wavelength of the light in air, $n_{wav}$ denotes the refractive index of the waveguide 110, $n_{out}$ denotes the refractive index of the medium on the light output side, and $\theta_{out}$ denotes the angle at which the light is emitted from the waveguide 110 to a substrate or to the air. From the formulae (2) to (4), the output angle $\theta_{out}$ can be represented by the equation (5):

$$n_{out} \sin \theta_{out} = n_{wav} \sin \theta_{wav} - m\lambda_0/p \quad (5)$$

If $n_{wav} \sin \theta_{wav} = m\lambda_0/p$ in the formula (5), this results in $\theta_{out} = 0$, meaning that the light can be emitted in the direction perpendicular to the plane of the waveguide 110 (that is, in the front direction).

Based on this principle, light can be coupled into a particular quasi-guided mode and be converted into light having a particular output angle using the periodic structure to emit intense light in that direction.

There are some constraints to achieving the above situation. To form a quasi-guided mode, light propagating through the waveguide 110 has to be totally reflected. The conditions therefor are represented by the formula (6):

$$n_{out} < n_{wav} \sin \theta_{wav} \quad (6)$$

To diffract the quasi-guided mode using the periodic structure and thereby emit light from the waveguide 110, $-1 < \sin \theta_{out} < 1$ has to be satisfied in the formula (5). Hence, the following formula (7) has to be satisfied:

$$-1 < \frac{n_{wav}}{n_{out}} \sin \theta_{wav} - \frac{m\lambda_0}{n_{out}p} < 1 \quad (7)$$

Taking into account the formula (6), the formula (8) has to be satisfied:

$$\frac{m\lambda_0}{2n_{out}} < p \quad (8)$$

To emit light from the waveguide 110 in the front direction ($\theta_{out}=0$), as can be seen from the formula (5), the formula (9) has to be satisfied:

$$p = m\lambda_0/(n_{wav} \sin \theta_{wav}) \quad (9)$$

As can be seen from the formulae (9) and (6), the required conditions are represented by the formula (10):

$$\frac{m\lambda_0}{n_{wav}} < p < \frac{m\lambda_0}{n_{out}} \quad (10)$$

The periodic structure as illustrated in FIGS. 8A and 8B may be designed based on first-order diffracted light (that is, m=1) because higher-order diffracted light having m of 2 or more has low diffraction efficiency. In this embodiment, the period p of the periodic structure 120 is determined so as to satisfy the formula (11), which is given by substituting m=1 into the formula (10):

$$\frac{\lambda_0}{n_{wav}} < p < \frac{\lambda_0}{n_{out}} \quad (11)$$

If the waveguide (photoluminescent layer) 110 is not in contact with a transparent substrate, as illustrated in FIGS. 8A and 8B, $n_{out}$ is equal to the refractive index of air (approximately 1.0). Thus, the period p is determined so as to satisfy the formula (12):

$$\frac{\lambda_0}{n_{wav}} < p < \lambda_0 \quad (12)$$

Figure 8C:
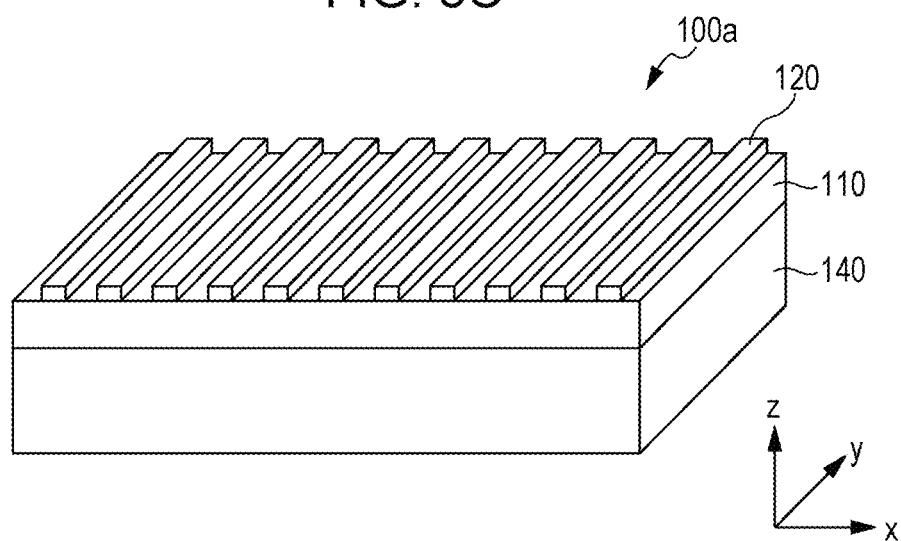
FIG. 8C is a perspective view of the structure of a light-emitting device according to another embodiment.
Figure 8D:
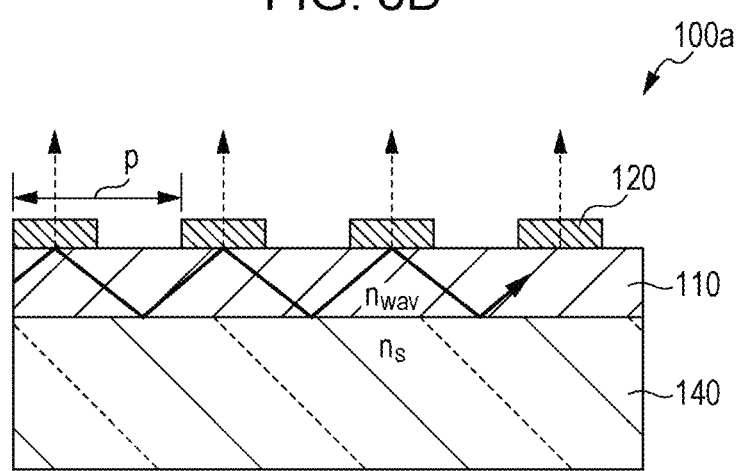
FIG. 8D is a fragmentary cross-sectional view of the light-emitting device illustrated in FIG. 8C.

Alternatively, a structure as illustrated in FIGS. 8C and 8D may be employed in which the photoluminescent layer 110 and the periodic structure 120 are formed on a transparent substrate 140. The refractive index $n_s$ of the transparent substrate 140 is higher than the refractive index of air. Thus, the period p is determined so as to satisfy the formula (13), which is given by substituting $n_{out}=n_s$ into the formula (11):

$$\frac{\lambda_0}{n_{wav}} < p < \frac{\lambda_0}{n_s} \quad (13)$$

Although m=1 is assumed in the formula (10) to give the formulae (12) and (13), m may be 2 or more. That is, if both surfaces of the light-emitting device 100 are in contact with air layers, as shown in FIGS. 8A and 8B, the period p may be determined so as to satisfy the formula (14):

$$\frac{m\lambda_0}{n_{wav}} < p < m\lambda_0 \quad (14)$$

wherein m is an integer of 1 or more.

Similarly, if the photoluminescent layer 110 is formed on the transparent substrate 140, as in the light-emitting device 100a illustrated in FIGS. 8C and 8D, the period p may be determined so as to satisfy the formula (15):

$$\frac{m\lambda_0}{n_{wav}} < p < \frac{m\lambda_0}{n_s} \quad (15)$$

By determining the period p of the periodic structure so as to satisfy the above formulae, light from the photoluminescent layer 110 can be emitted in the front direction. Thus, a directional light-emitting apparatus can be provided.

3. Verification by Calculations 3-1. Period and Wavelength Dependence

The inventors verified, by optical analysis, whether light emission in a particular direction as described above is actually possible. The optical analysis was performed by calculations using DiffractMOD available from Cybernet Systems Co., Ltd. In these calculations, the change in the absorption of external light incident perpendicular to a light-emitting device by a photoluminescent layer was calculated to determine the enhancement of light output perpendicular to the light-emitting device. The calculation of the process by which external incident light is coupled into a quasi-guided mode and is absorbed by the photoluminescent layer corresponds to the calculation of a process opposite to the process by which light emitted from the photoluminescent layer is coupled into a quasi-guided mode and is converted into propagating light output perpendicular to the light-emitting device. Similarly, the electric field distribution of a quasi-guided mode was calculated from the electric field of external incident light.

Figure 9:
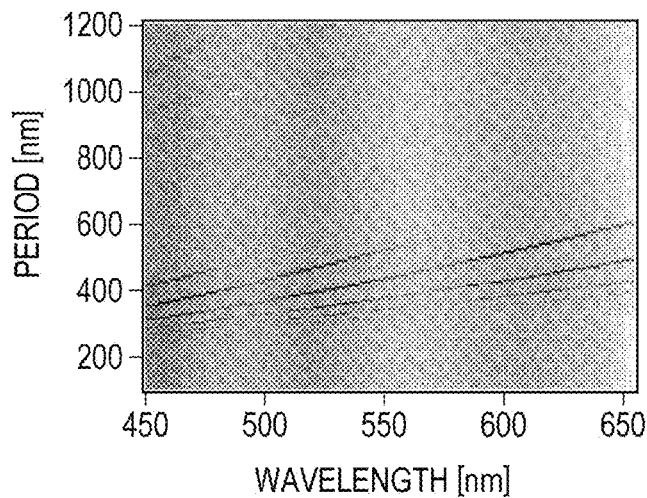
FIG. 9 is a graph showing the calculation results of the enhancement of light emitted in the front direction with varying emission wavelengths and varying a period of a periodic structure.

FIG. 9 shows the calculation results of the enhancement of light emitted in the front direction with varying emission wavelengths and varying periods of the periodic structure. The photoluminescent layer had a thickness of 1 μm and a refractive index $n_{wav}$ of 1.8, and the periodic structure had a height of 50 nm and a refractive index of 1.5. In these calculations, the periodic structure was a one-dimensional periodic structure uniform in the y direction, as illustrated in FIG. 8A, and the polarization of light was in the TM mode, which has an electric field component parallel to the y direction. The results in FIG. 9 show that there are enhancement peaks at certain combinations of wavelength and period. In FIG. 9, the magnitude of the enhancement is expressed by different shades of color; a darker color (black) indicates higher enhancement, whereas a lighter color (white) indicates lower enhancement.

Figure 10:
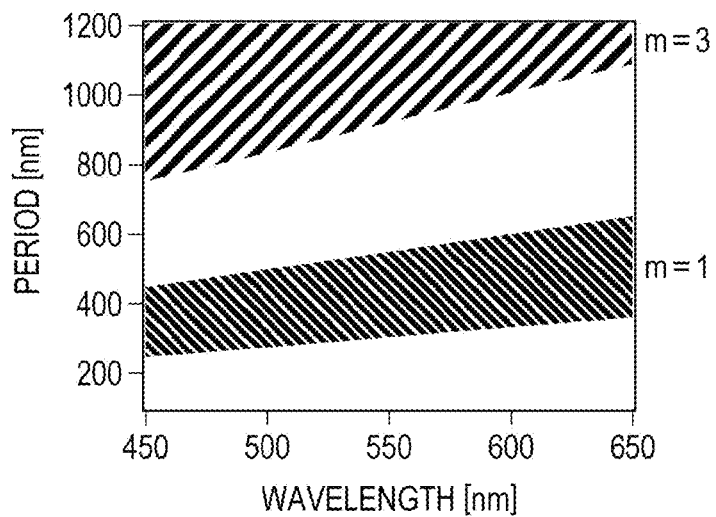
FIG. 10 is a graph illustrating the conditions for m=1 and m=3 in the formula (10)
Figure 19:
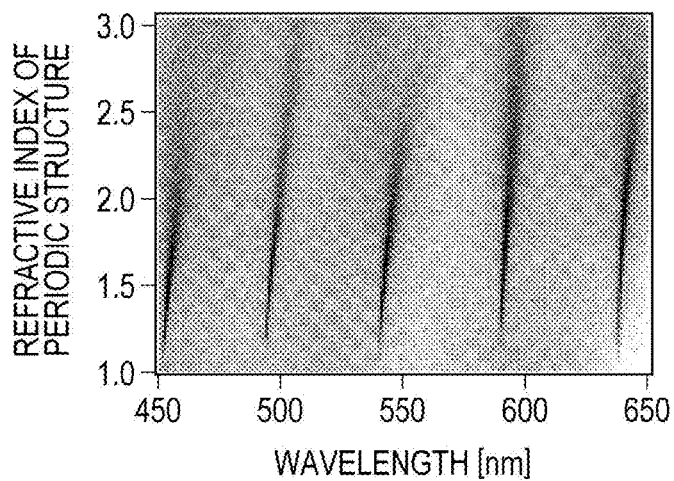
FIG. 19 is a graph showing the results of calculations performed under the same conditions as in FIG. 16 except that polarization of light is in a TE mode, which has an electric field component perpendicular to the y direction.

In the above calculations, the periodic structure had a rectangular cross section as illustrated in FIG. 8B. FIG. 10 is a graph illustrating the conditions for m=1 and m=3 in the formula (10). A comparison between FIGS. 9 and 19 shows that the peaks in FIG. 9 are located within the regions corresponding to m=1 and m=3. The intensity is higher for m=1 because first-order diffracted light has a higher diffraction efficiency than third- or higher-order diffracted light. There is no peak for m=2 because of low diffraction efficiency in the periodic structure.

In FIG. 9, a plurality of lines are observed in each of the regions corresponding to m=1 and m=3 in FIG. 10. This indicates the presence of a plurality of quasi-guided modes.

3-2. Thickness Dependence

Figure 11:
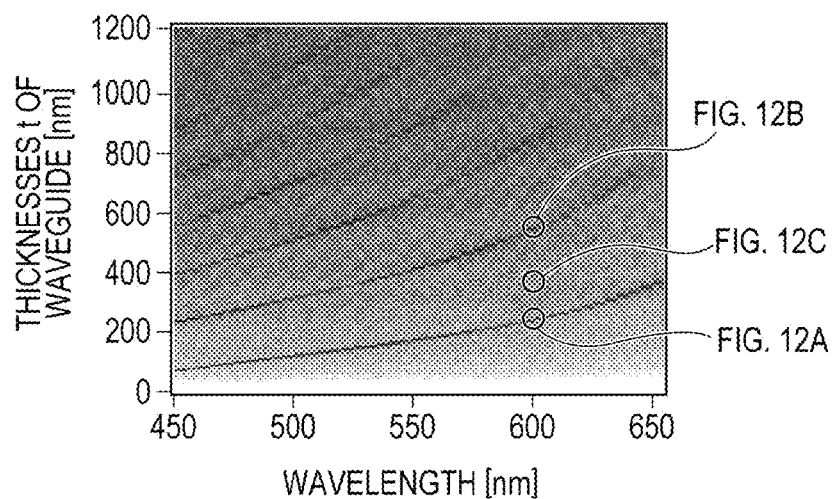
FIG. 11 is a graph showing the calculation results of the enhancement of light emitted in the front direction with varying emission wavelengths and varying thicknesses t of a photoluminescent layer.

FIG. 11 is a graph showing the calculation results of the enhancement of light emitted in the front direction with varying emission wavelengths and varying thicknesses t of the photoluminescent layer. The photoluminescent layer had a refractive index $n_{wav}$ of 1.8, and the periodic structure had a period of 400 nm, a height of 50 nm, and a refractive index of 1.5. FIG. 11 shows that the enhancement of light is highest at a particular thickness t of the photoluminescent layer.

Figure 12A:
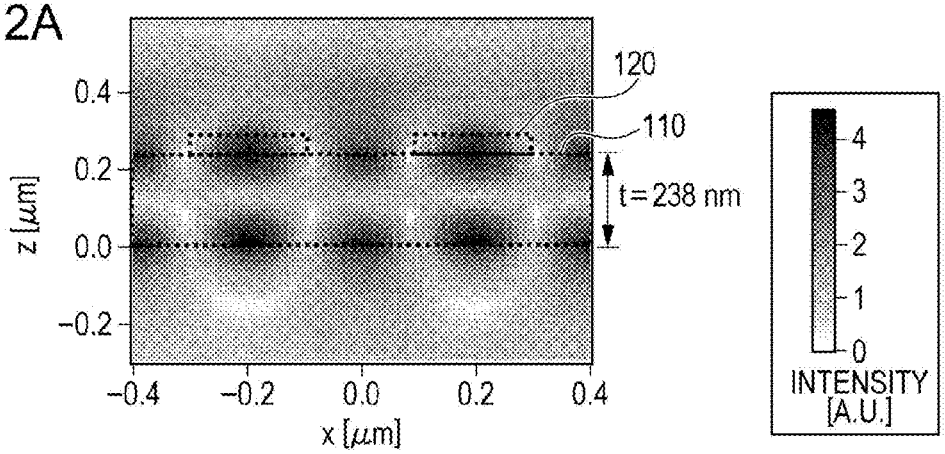
FIG. 12A is a graph showing the calculation results of the electric field distribution in a mode to guide light in the x direction for a thickness t of 238 nm.
Figure 12B:
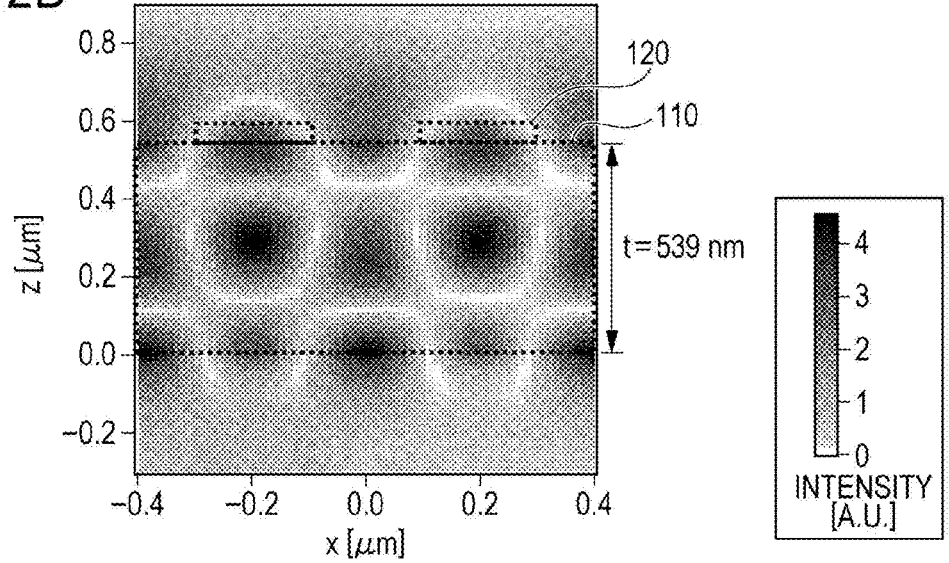
FIG. 12B is a graph showing the calculation results of the electric field distribution in a mode to guide light in the x direction for a thickness t of 539 nm.
Figure 12C:
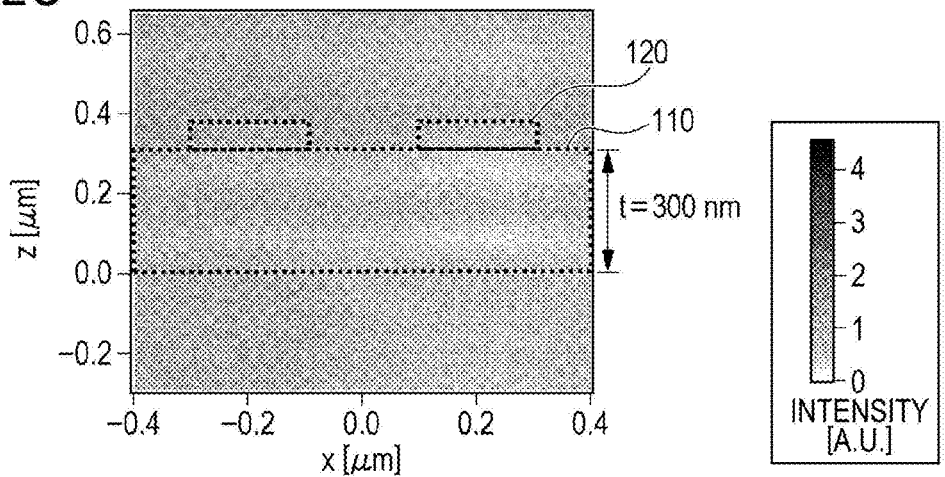
FIG. 12C is a graph showing the calculation results of the electric field distribution in a mode to guide light in the x direction for a thickness t of 300 nm.

FIGS. 12A and 12B show the calculation results of the electric field distributions in a mode to guide light in the x direction for a wavelength of 600 nm and thicknesses t of 238 nm and 539 nm, respectively, at which there are peaks in FIG. 11. For comparison, FIG. 12C shows the results of similar calculations for a thickness t of 300 nm, at which there is no peak. In these calculations, as in the above calculations, the periodic structure was a one-dimensional periodic structure uniform in the y direction. In each figure, a black region indicates a higher electric field intensity, whereas a white region indicates a lower electric field intensity. Whereas the results for t=238 nm and t=539 nm show high electric field intensity, the results for t=300 nm show low electric field intensity as a whole. This is because there are guided modes for t=238 nm and t=539 nm so that light is strongly confined. Furthermore, regions with the highest electric field intensity (antinodes) are necessarily present in or directly below the projections, indicating the correlation between the electric field and the periodic structure 120. Thus, the resulting guided mode depends on the arrangement of the periodic structure 120. A comparison between the results for t=238 nm and t=539 nm shows that these modes differ by one in the number of nodes (white regions) of the electric field in the z direction.

3-3. Polarization Dependence

Figure 13:
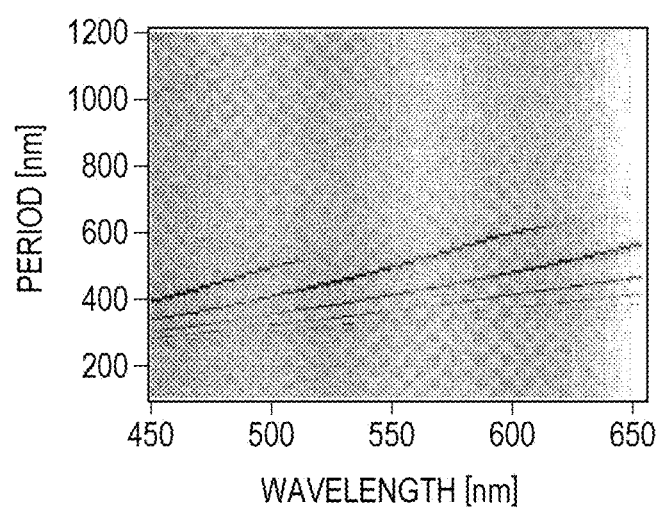
FIG. 13 is a graph showing the calculation results of the enhancement of light under the same conditions as in FIG. 9 except that polarization of light is in a TE mode, which has an electric field component perpendicular to the y direction.

To examine the polarization dependence, the enhancement of light was calculated under the same conditions as in FIG. 9 except that the polarization of light was in the TE mode, which has an electric field component perpendicular to the y direction. FIG. 13 shows the results of these calculations. Although the peaks in FIG. 13 differ slightly in position from the peaks for the TM mode (FIG. 9), they are located within the regions shown in FIG. 10. This demonstrates that the structure according to this embodiment is effective for both the TM mode and the TE mode.

3-4. Two-Dimensional Periodic Structure

Figure 14A:
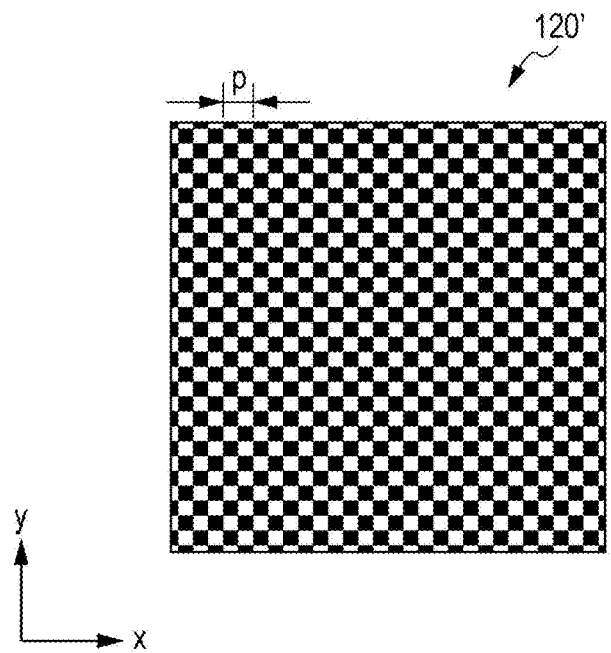
FIG. 14A is a plan view of a two-dimensional periodic structure.
Figure 14B:
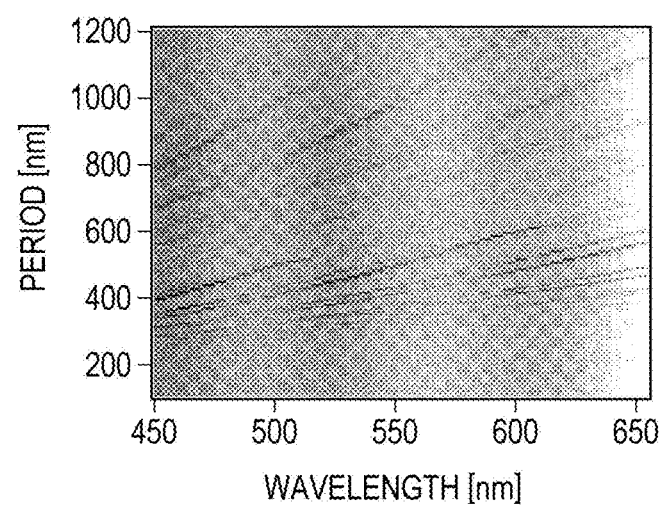
FIG. 14B is a graph showing the results of calculations performed as in FIG. 9 for the two-dimensional periodic structure.

The effect of a two-dimensional periodic structure was also studied. FIG. 14A is a partial plan view of a two-dimensional periodic structure 120' including recesses and projections arranged in both the x direction and the y direction. In FIG. 14A, the black regions indicate the projections, and the white regions indicate the recesses. For a two-dimensional periodic structure, both the diffraction in the x direction and the diffraction in the y direction have to be taken into account. Although the diffraction only in the x or y direction is similar to that in a one-dimensional periodic structure, a two-dimensional periodic structure can be expected to give different results from the one-dimensional periodic structure because diffraction also occurs in a direction containing both an x component and a y component (for example, at an angle of 45 degrees). FIG. 14B shows the calculation results of the enhancement of light for the two-dimensional periodic structure. The calculations were performed under the same conditions as in FIG. 9 except for the type of periodic structure. As shown in FIG. 14B, peaks matching the peaks for the TE mode in FIG. 13 were observed in addition to peaks matching the peaks for the TM mode in FIG. 9. These results demonstrate that the two-dimensional periodic structure also converts and outputs the TE mode by diffraction. For a two-dimensional periodic structure, diffraction that simultaneously satisfies the first-order diffraction conditions in both the x direction and the y direction also has to be taken into account. Such diffracted light is emitted at an angle corresponding to √2 times (that is, $2^{1/2}$ times) the period p. Thus, peaks will occur at √2 times the period p in addition to peaks that occur in a one-dimensional periodic structure. Such peaks are also observed in FIG. 14B.

Figure 25A:
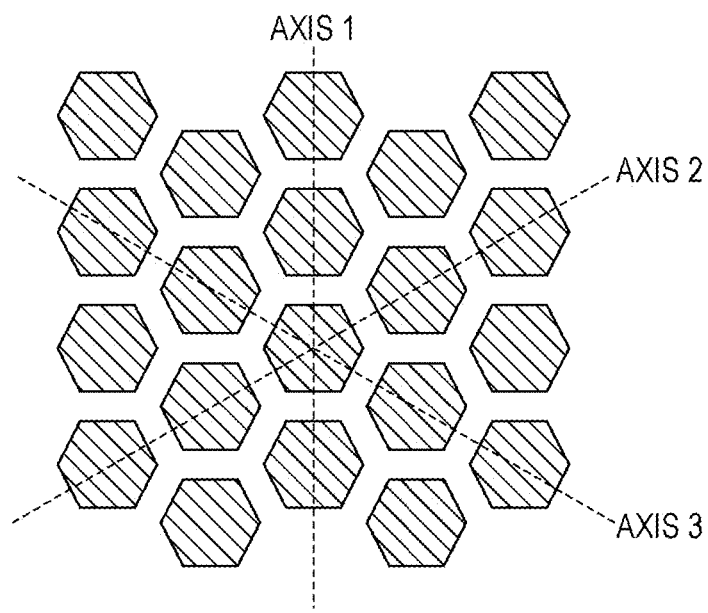
FIG. 25A is a schematic view of a two-dimensional periodic structure.
Figure 25B:
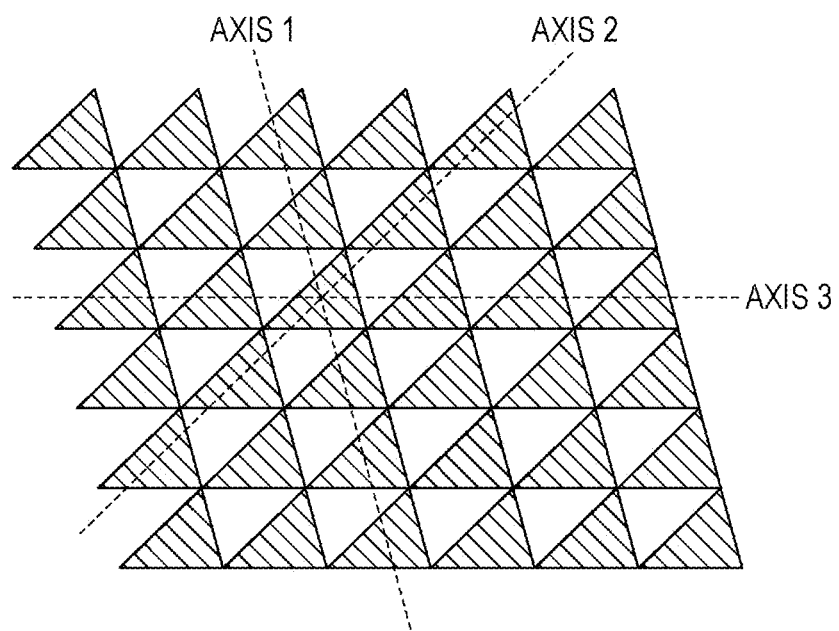
FIG. 25B is a schematic view of another two-dimensional periodic structure.

The two-dimensional periodic structure does not have to be a square grid structure having equal periods in the x direction and the y direction, as illustrated in FIG. 14A, but may be a hexagonal grid structure, as illustrated in FIG. 25A, or a triangular grid structure, as illustrated in FIG. 25B. The two-dimensional periodic structure may have different periods in different directions (for example, in the x direction and the y direction for a square grid structure).

In this embodiment, as demonstrated above, light in a characteristic quasi-guided mode formed by the periodic structure and the photoluminescent layer can be selectively emitted only in the front direction through diffraction by the periodic structure. With this structure, the photoluminescent layer can be excited with excitation light such as ultraviolet light or blue light to emit directional light.

4. Study on Constructions of Periodic Structure and Photoluminescent Layer

The effects of changes in various conditions such as the constructions and refractive indices of the periodic structure and the photoluminescent layer will now be described.

4-1. Refractive Index of Periodic Structure

Figure 15:
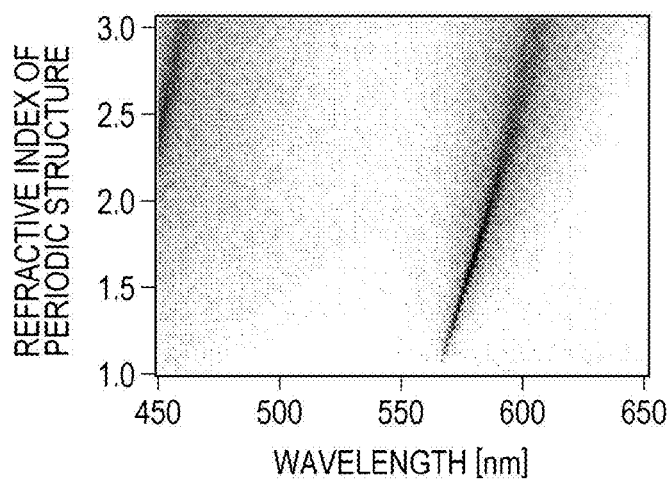
FIG. 15 is a graph showing the calculation results of the enhancement of light emitted in the front direction with varying emission wavelengths and varying refractive indices of the periodic structure.
Figure 16:
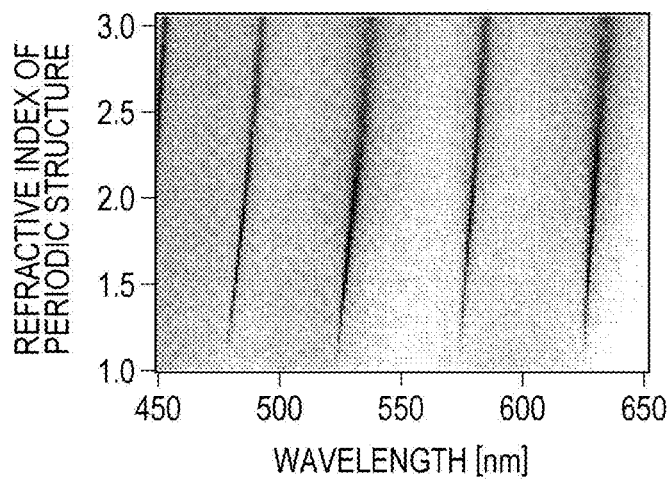
FIG. 16 is a graph showing the results obtained under the same conditions as in FIG. 15 except that the photoluminescent layer has a thickness of 1000 nm.

The refractive index of the periodic structure was studied. In the calculations performed herein, the photoluminescent layer had a thickness of 200 nm and a refractive index $n_{wav}$ of 1.8, the periodic structure was a one-dimensional periodic structure uniform in the y direction, as illustrated in FIG. 8A, and had a height of 50 nm and a period of 400 nm, and the polarization of light was in the TM mode, which has an electric field component parallel to the y direction. FIG. 15 shows the calculation results of the enhancement of light emitted in the front direction with varying emission wavelengths and varying refractive indices of the periodic structure. FIG. 16 shows the results obtained under the same conditions except that the photoluminescent layer had a thickness of 1000 nm.

The results show that the photoluminescent layer having a thickness of 1000 nm (FIG. 16) results in a smaller shift in the wavelength at which the light intensity is highest (the wavelength is hereinafter referred to as a peak wavelength) with the change in the refractive index of the periodic structure than the photoluminescent layer having a thickness of 200 nm (FIG. 15). This is because the quasi-guided mode is more affected by the refractive index of the periodic structure as the photoluminescent layer is thinner. Specifically, a periodic structure having a higher refractive index increases the effective refractive index and thus shifts the peak wavelength toward longer wavelengths, and this effect is more noticeable as the photoluminescent layer is thinner. The effective refractive index is determined by the refractive index of the medium present in the region where the electric field of the quasi-guided mode is distributed.

The results also show that a periodic structure having a higher refractive index results in a broader peak and lower intensity. This is because a periodic structure having a higher refractive index emits light in the quasi-guided mode at a higher rate and is therefore less effective in confining light, that is, has a lower Q value. To maintain high peak intensity, a structure may be employed in which light is moderately emitted using a quasi-guided mode that is effective in confining light (that is, has a high Q value). This means that it is undesirable to use a periodic structure formed of a material having a much higher refractive index than the photoluminescent layer. Thus, in order to increase the peak intensity and Q value, the refractive index of a dielectric material constituting the periodic structure (that is, the light-transmissive layer) can be lower than or similar to the refractive index of the photoluminescent layer. This is also true if the photoluminescent layer contains materials other than photoluminescent materials.

4-2. Height of Periodic Structure

Figure 17:
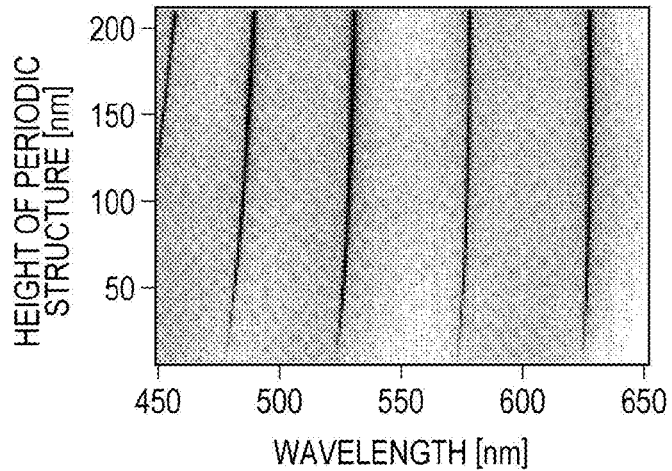
FIG. 17 is a graph showing the calculation results of the enhancement of light emitted in the front direction with varying emission wavelengths and varying heights of the periodic structure.
Figure 18:
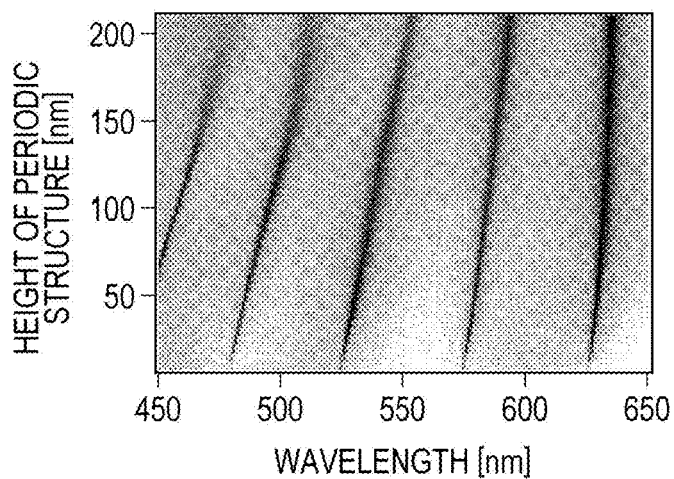
FIG. 18 is a graph showing the results of calculations performed under the same conditions as in FIG. 17 except that the periodic structure has a refractive index $n_p$ of 2.0.

The height of the periodic structure was then studied. In the calculations performed herein, the photoluminescent layer had a thickness of 1000 nm and a refractive index $n_{wav}$ of 1.8, the periodic structure was a one-dimensional periodic structure uniform in the y direction, as illustrated in FIG. 8A, and had a refractive index $n_p$ of 1.5 and a period of 400 nm, and the polarization of light was in the TM mode, which has an electric field component parallel to the y direction. FIG. 17 shows the calculation results of the enhancement of light emitted in the front direction with varying emission wavelengths and varying heights of the periodic structure. FIG. 18 shows the results of calculations performed under the same conditions except that the periodic structure has a refractive index $n_p$ of 2.0. Whereas the results in FIG. 17 show that the peak intensity and the Q value (that is, the peak line width) do not change when the periodic structure has at least a certain height, the results in FIG. 18 show that the peak intensity and the Q value decrease with increasing height of the periodic structure. If the refractive index $n_{wav}$ of the photoluminescent layer is higher than the refractive index $n_p$ of the periodic structure (FIG. 17), light is totally reflected, and only a leaking (evanescent) portion of the electric field of the quasi-guided mode interacts with the periodic structure. If the periodic structure has a sufficiently large height, the influence of the interaction between the evanescent portion of the electric field and the periodic structure remains constant irrespective of the height. In contrast, if the refractive index $n_{wav}$ of the photoluminescent layer is lower than the refractive index $n_p$ of the periodic structure (FIG. 18), light reaches the surface of the periodic structure without being totally reflected and is therefore more influenced by the periodic structure with a larger height. As shown in FIG. 18, a height of approximately 100 nm is sufficient, and the peak intensity and the Q value decrease above a height of 150 nm. Thus, if the refractive index $n_{wav}$ of the photoluminescent layer is lower than the refractive index $n_p$ of the periodic structure, the periodic structure may have a height of 150 nm or less to achieve a high peak intensity and Q value.

4-3. Polarization Direction

The polarization direction was then studied. FIG. 19 shows the results of calculations performed under the same conditions as in FIG. 16 except that the polarization of light was in the TE mode, which has an electric field component perpendicular to the y direction. The TE mode is more influenced by the periodic structure than the TM mode because the electric field of the quasi-guided mode leaks more largely in the TE mode than in the TM mode. Thus, the peak intensity and the Q value decrease more significantly in the TE mode than in the TM mode if the refractive index $n_p$ of the periodic structure is higher than the refractive index $n_{wav}$ of the photoluminescent layer.

4-4. Refractive Index of Photoluminescent Layer

Figure 20:
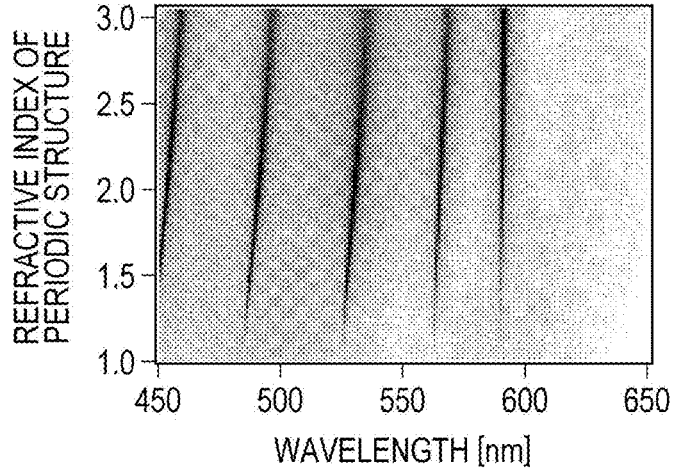
FIG. 20 is a graph showing the results of calculations performed under the same conditions as in FIG. 16 except that the photoluminescent layer has a refractive index $n_{wav}$ of 1.5.

The refractive index of the photoluminescent layer was then studied. FIG. 20 shows the results of calculations performed under the same conditions as in FIG. 16 except that the photoluminescent layer had a refractive index $n_{wav}$ of 1.5. The results for the photoluminescent layer having a refractive index $n_{wav}$ of 1.5 are similar to the results in FIG. 16. However, light having a wavelength of 600 nm or more was not emitted in the front direction. This is because, from the formula (10), $\lambda_0 < n_{wav} \times p/m = 1.5 \times 400 \text{ nm}/1 = 600 \text{ nm}$.

The above analysis demonstrates that a high peak intensity and Q value can be achieved if the periodic structure has a refractive index lower than or similar to the refractive index of the photoluminescent layer or if the periodic structure has a higher refractive index than the photoluminescent layer and a height of 150 nm or less.

5. Modified Examples

Modified examples of the present embodiment will be described below.

5-1. Structure Including Substrate

As described above, the light-emitting device may have a structure in which the photoluminescent layer 110 and the periodic structure 120 are formed on the transparent substrate 140, as illustrated in FIGS. 8C and 8D. Such a light-emitting device 100a may be produced by forming a thin film of the photoluminescent material for the photoluminescent layer 110 (optionally containing a matrix material; the same applies hereinafter) on the transparent substrate 140 and then forming the periodic structure 120 thereon. In this structure, the refractive index $n_s$ of the transparent substrate 140 has to be lower than or equal to the refractive index $n_{wav}$ of the photoluminescent layer 110 so that the photoluminescent layer 110 and the periodic structure 120 function to emit light in a particular direction. If the transparent substrate 140 is provided in contact with the photoluminescent layer 110, the period p has to be set so as to satisfy the formula (15), which is given by replacing the refractive index $n_{out}$ of the output medium in the formula (10) by $n_s$.

Figure 21:
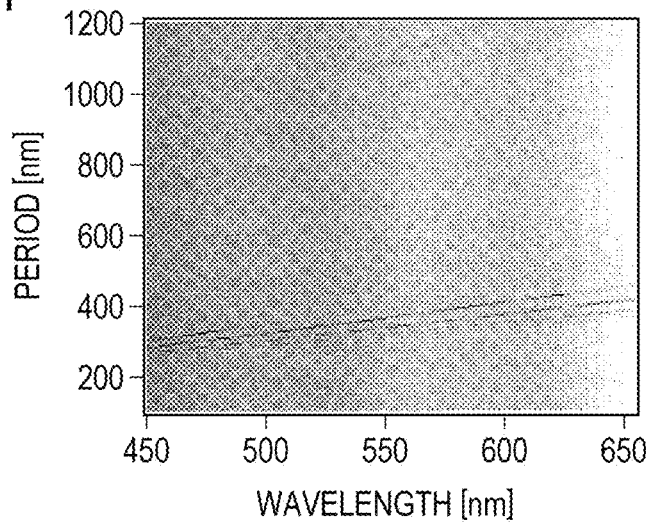
FIG. 21 is a graph showing the results of calculations performed under the same conditions as in FIG. 9 except that the photoluminescent layer and the periodic structure are disposed on a transparent substrate having a refractive index of 1.5.
Figure 22:
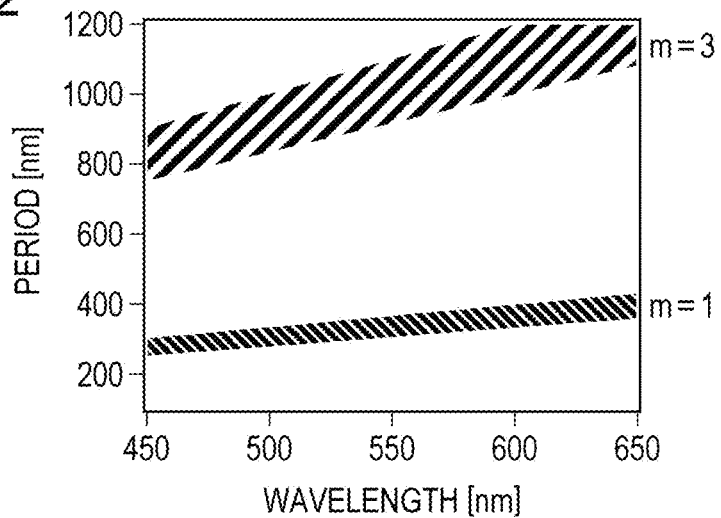
FIG. 22 is a graph illustrating the condition represented by the formula (15)

To demonstrate this, calculations were performed under the same conditions as in FIG. 9 except that the photoluminescent layer 110 and the periodic structure 120 were disposed on a transparent substrate 140 having a refractive index of 1.5. FIG. 21 shows the results of these calculations. As in the results in FIG. 9, light intensity peaks are observed at particular periods for each wavelength, although the ranges of periods where peaks appear differ from those in FIG. 9. FIG. 22 is a graph illustrating the condition represented by the formula (15), which is given by substituting $n_{out}=n_s$ into the formula (10). In FIG. 21, light intensity peaks are observed in the regions corresponding to the ranges shown in FIG. 22.

Thus, for the light-emitting device 100a, in which the photoluminescent layer 110 and the periodic structure 120 are disposed on the transparent substrate 140, a period p that satisfies the formula (15) is effective, and a period p that satisfies the formula (13) is significantly effective.

5-2. Light-Emitting Apparatus Including Excitation Light Source

Figure 23:
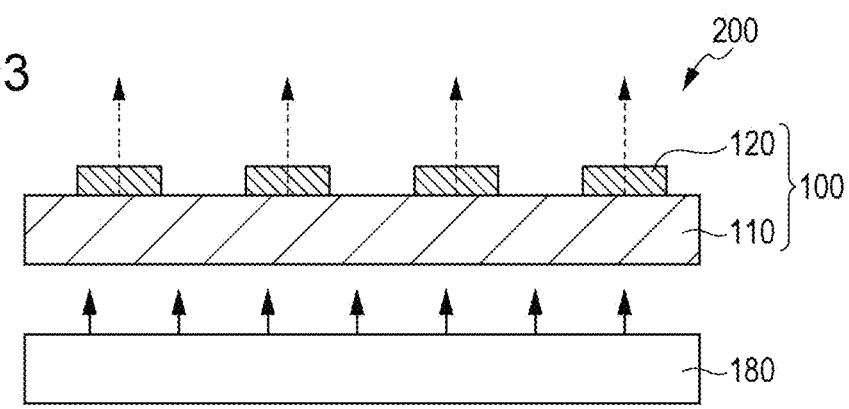
FIG. 23 is a schematic view of a light-emitting apparatus including a light-emitting device illustrated in FIGS. 8A and 8B and a light source that emits excitation light toward a photoluminescent layer.

FIG. 23 is a schematic view of a light-emitting apparatus 200 including the light-emitting device 100 illustrated in FIGS. 8A and 8B and a light source 180 that emits excitation light toward the photoluminescent layer 110. In this embodiment, as described above, the photoluminescent layer can be excited with excitation light, such as ultraviolet light or blue light, and emit directional light. The light-emitting apparatus 200 including the light source 180 that can emit such excitation light can emit directional light. Although the wavelength of excitation light from the light source 180 is typically within the ultraviolet or blue range, it is not necessarily within these ranges, but may be determined depending on the photoluminescent material for the photoluminescent layer 110. Although the light source 180 illustrated in FIG. 23 is configured to direct excitation light into the bottom surface of the photoluminescent layer 110, it may be configured otherwise, for example, to direct excitation light into the top surface of the photoluminescent layer 110.

Figure 24A:
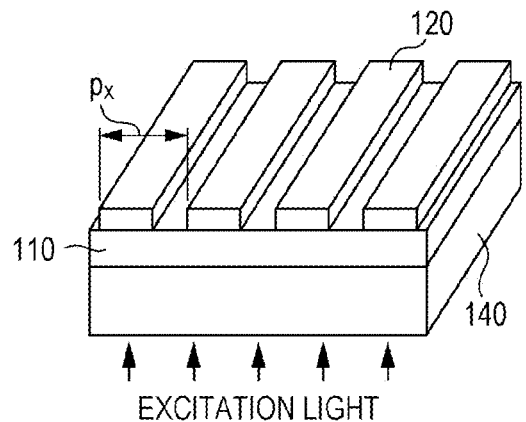
FIG. 24A is a first explanatory view of a structure that can couple excitation light into a quasi-guided mode and thereby efficiently emit light.
Figure 24B:
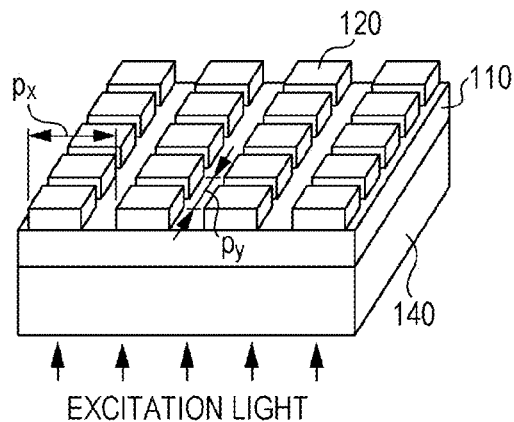
FIG. 24B is a second explanatory view of a structure that can couple excitation light into a quasi-guided mode and thereby efficiently emit light.

Excitation light may be coupled into a quasi-guided mode to efficiently emit light. FIGS. 24A to 24D illustrate such a method. In this example, as in the structure illustrated in FIGS. 8C and 8D, the photoluminescent layer 110 and the periodic structure 120 are formed on the transparent substrate 140. As illustrated in FIG. 24A, the period $p_x$ in the x direction is first determined so as to enhance light emission. As illustrated in FIG. 24B, the period $p_y$ in the y direction is then determined so as to couple excitation light into a quasi-guided mode. The period $p_x$ is determined so as to satisfy the condition given by replacing p by $p_x$ in the formula (10). The period $p_y$ is determined so as to satisfy the formula (16):

$$\frac{m\lambda_{ex}}{n_{wav}} < p_y < \frac{m\lambda_{ex}}{n_{out}} \quad (16)$$

wherein m is an integer of 1 or more, $\lambda_{ex}$ denotes the wavelength of excitation light, and $n_{out}$ denotes the refractive index of a medium having the highest refractive index of the media in contact with the photoluminescent layer 110 except the periodic structure 120.

In the example in FIGS. 24A to 24D, $n_{out}$ denotes the refractive index $n_s$ of the transparent substrate 140. For a structure including no transparent substrate 140, as illustrated in FIG. 23, $n_{out}$ denotes the refractive index of air (approximately 1.0).

In particular, excitation light can be more effectively converted into a quasi-guided mode if m=1, that is, if the period $p_y$ is determined so as to satisfy the formula (17):

$$\frac{\lambda_{ex}}{n_{wav}} < p_y < \frac{\lambda_{ex}}{n_{out}} \quad (17)$$

Thus, excitation light can be converted into a quasi-guided mode if the period $p_y$ is set so as to satisfy the condition represented by the formula (16) (particularly, the condition represented by the formula (17)). As a result, the photoluminescent layer 110 can efficiently absorb excitation light of the wavelength $\lambda_{ex}$.

Figure 24C:
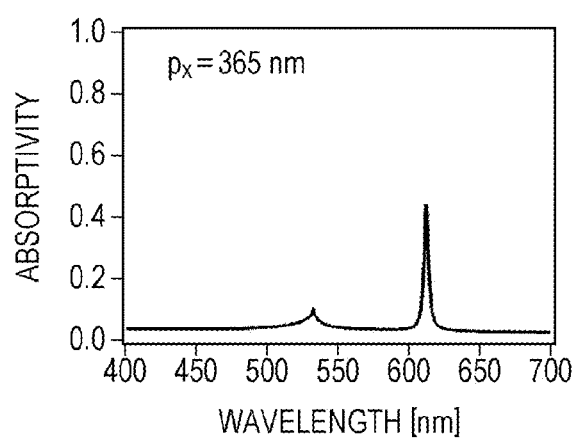
FIG. 24C is a graph showing the wavelength dependence of light absorptivity in the structure illustrated in FIG. 24A.
Figure 24D:
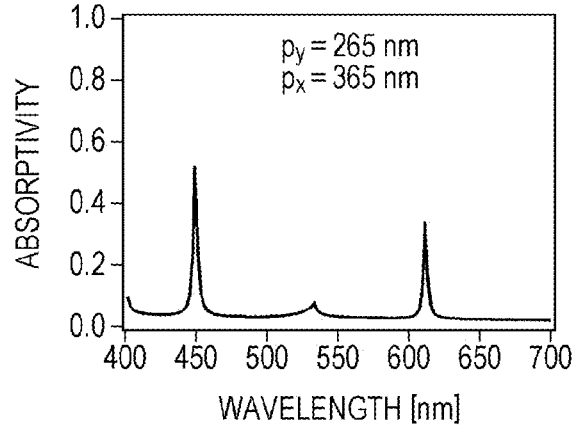
FIG. 24D is a graph showing the wavelength dependence of light absorptivity in the structure illustrated in FIG. 24B.

FIGS. 24C and 24D are the calculation results of the proportion of absorbed light to light incident on the structures shown in FIGS. 24A and 24B, respectively, for each wavelength. In these calculations, $p_x=365$ nm, $p_y=265$ nm, the photoluminescent layer 110 had an emission wavelength $\lambda$ of about 600 nm, excitation light had a wavelength $\lambda_{ex}$ of about 450 nm, and the photoluminescent layer 110 had an extinction coefficient of 0.003. As shown in FIG. 24D, the photoluminescent layer 110 has high absorptivity not only for light emitted from the photoluminescent layer 110, but also for excitation light, that is, light having a wavelength of approximately 450 nm. This indicates that incident light is effectively converted into a quasi-guided mode and thereby increases the proportion of light absorbed into the photoluminescent layer 110. The photoluminescent layer 110 also has high absorptivity for the emission wavelength, that is, approximately 600 nm. This indicates that light having a wavelength of approximately 600 nm incident on this structure is similarly effectively converted into a quasi-guided mode. The periodic structure 120 shown in FIG. 24B is a two-dimensional periodic structure including structures having different periods (different periodic components) in the x direction and the y direction. Such a two-dimensional periodic structure including multiple periodic components allows for high excitation efficiency and high output intensity. Although excitation light is incident on the transparent substrate 140 in FIGS. 24A to 24D, the same effect can be achieved even if excitation light is incident on the periodic structure 120.

Also available are two-dimensional periodic structures including periodic components as illustrated in FIGS. 25A and 25B. The structure illustrated in FIG. 25A includes periodically arranged projections or recesses having a hexagonal planar shape. The structure illustrated in FIG. 25B includes periodically arranged projections or recesses having a triangular planar shape. These structures have major axes (axes 1 to 3 in these examples) that can be assumed to be periodic. Thus, the structures can have different periods in different axial directions. These periods may be set so as to increase the directionality of light beams of different wavelengths or to efficiently absorb excitation light. In any case, each period is set so as to satisfy the condition corresponding to the formula (10).

5-3. Periodic Structure on Transparent Substrate

Figure 26A:
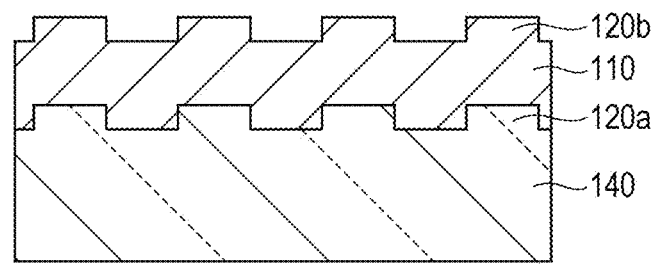
FIG. 26A is a schematic view of a modified example in which a periodic structure is formed on a transparent substrate.
Figure 26B:
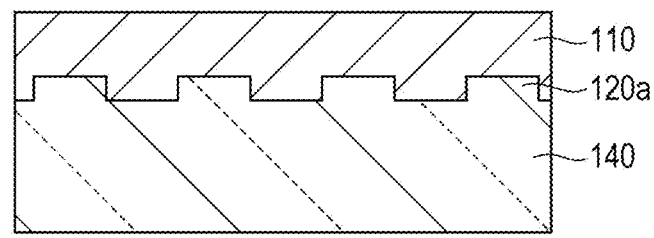
FIG. 26B is a schematic view of another modified example in which a periodic structure is formed on a transparent substrate.
Figure 26C:
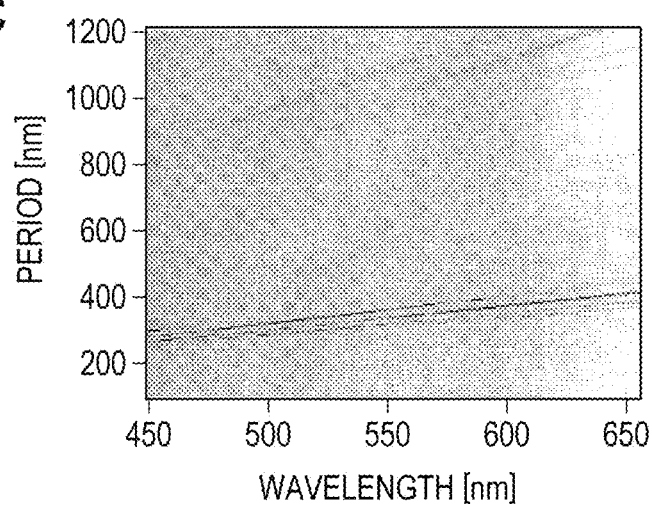
FIG. 26C is a graph showing the calculation results of the enhancement of light emitted from the structure illustrated in FIG. 26A in the front direction with varying emission wavelengths and varying periods of the periodic structure.

As illustrated in FIGS. 26A and 26B, a periodic structure 120a may be formed on the transparent substrate 140, and the photoluminescent layer 110 may be disposed thereon. In the example in FIG. 26A, the photoluminescent layer 110 is formed along the texture of the periodic structure 120a on the transparent substrate 140. As a result, a periodic structure 120b with the same period is formed in the surface of the photoluminescent layer 110. In the example in FIG. 26B, the surface of the photoluminescent layer 110 is flattened. In these examples, directional light emission can be achieved by setting the period p of the periodic structure 120a so as to satisfy the formula (15). To verify the effect of these structures, the enhancement of light emitted from the structure in FIG. 26A in the front direction was calculated with varying emission wavelengths and varying periods of the periodic structure. In these calculations, the photoluminescent layer 110 had a thickness of 1000 nm and a refractive index $n_{wav}$ of 1.8, the periodic structure 120a was a one-dimensional periodic structure uniform in the y direction and had a height of 50 nm, a refractive index $n_p$ of 1.5, and a period of 400 nm, and the polarization of light was in the TM mode, which has an electric field component parallel to the y direction. FIG. 26C shows the results of these calculations. In these calculations, light intensity peaks were observed at the periods that satisfy the condition represented by the formula (15).

5-4. Powder

According to these embodiments, light of any wavelength can be enhanced by adjusting the period of the periodic structure and/or the thickness of the photoluminescent layer. For example, if the structure illustrated in FIGS. 8A and 8B is formed using a photoluminescent material that emits light over a wide wavelength range, only light of a certain wavelength can be enhanced. The structure of the light-emitting device 100 as illustrated in FIGS. 8A and 8B may be provided in powder form for use as a fluorescent material. Alternatively, the light-emitting device 100 as illustrated in FIGS. 8A and 8B may be embedded in resin or glass.

Figure 27:
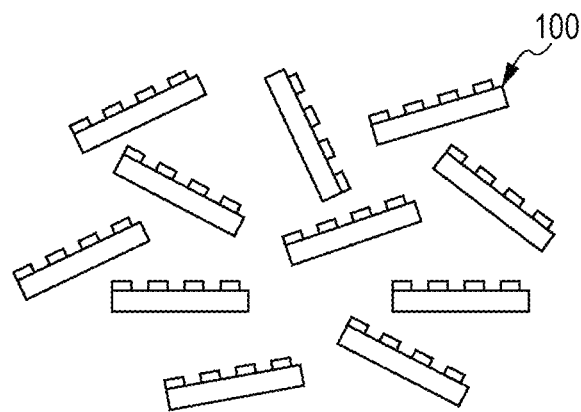
FIG. 27 is a schematic view of a mixture of light-emitting devices in powder form.

The single structure as illustrated in FIGS. 8A and 8B can emit only light of a certain wavelength in a particular direction and is therefore not suitable for light having a wide wavelength spectrum, such as white light. As shown in FIG. 27, light-emitting devices 100 that differ in the conditions such as the period of the periodic structure and the thickness of the photoluminescent layer may be mixed in powder form to provide a light-emitting apparatus with a wide wavelength spectrum. In such a case, the individual light-emitting devices 100 have sizes of, for example, several micrometers to several millimeters in one direction and can include, for example, one- or two-dimensional periodic structures with several periods to several hundreds of periods.

5-5. Array of Structures with Different Periods

Figure 28:
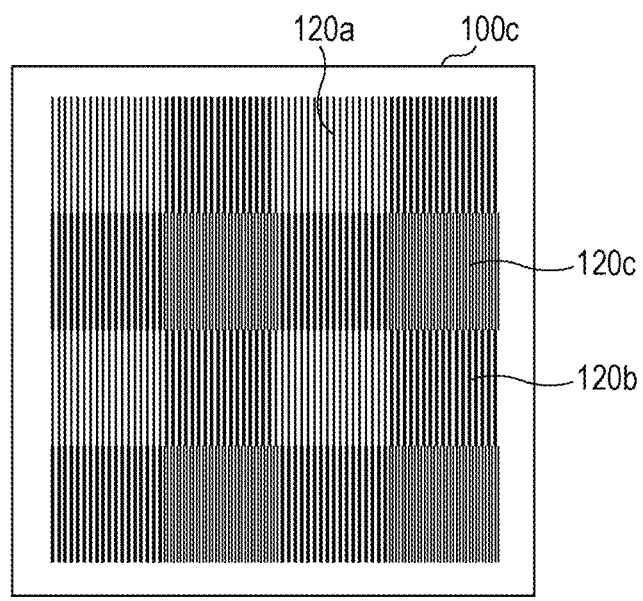
FIG. 28 is a plan view of a two-dimensional array of periodic structures having different periods on a photoluminescent layer.

FIG. 28 is a plan view of a two-dimensional array of periodic structures having different periods on a photoluminescent layer. In this example, three types of periodic structures 120a, 120b, and 120c are arranged without any space therebetween. The periods of the periodic structures 120a, 120b, and 120c are set so as to emit, for example, light in the red, green, and blue wavelength ranges, respectively, in the front direction. Such structures having different periods can be arranged on the photoluminescent layer to emit directional light with a wide wavelength spectrum. The periodic structures are not necessarily formed as described above, but may be formed in any manner.

5-6. Layered Structure

Figure 29:
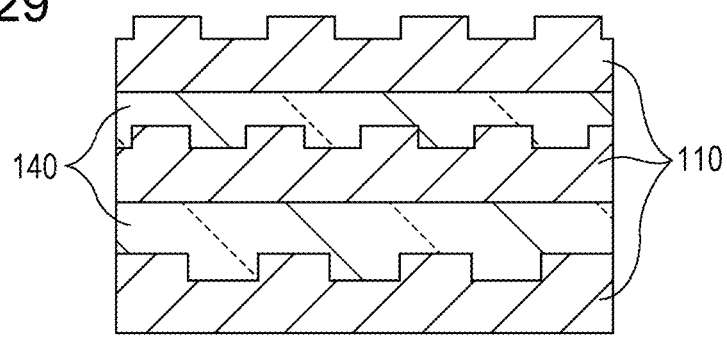
FIG. 29 is a schematic view of a light-emitting device including photoluminescent layers each having a textured surface.

FIG. 29 illustrates a light-emitting device including photoluminescent layers 110 each having a textured surface. A transparent substrate 140 is disposed between the photoluminescent layers 110. The texture on each of the photoluminescent layers 110 corresponds to the periodic structure or the submicron structure. The example in FIG. 29 includes three periodic structures having different periods. The periods of these periodic structures are set so as to emit light in the red, green, and blue wavelength ranges in the front direction. The photoluminescent layer 110 in each layer is formed of a material that emits light of the color corresponding to the period of the periodic structure in that layer. Thus, periodic structures having different periods can be stacked on top of each other to emit directional light with a wide wavelength spectrum.

The number of layers and the constructions of the photoluminescent layer 110 and the periodic structure in each layer are not limited to those described above, but may be selected as appropriate. For example, for a structure including two layers, first and second photoluminescent layers are formed opposite each other with a light-transmissive substrate therebetween, and first and second periodic structures are formed on the surfaces of the first and second photoluminescent layers, respectively. In such a case, the first photoluminescent layer and the first periodic structure satisfy the condition represented by the formula (15), and the second photoluminescent layer and the second periodic structure satisfy the condition represented by the formula (15). For a structure including three or more layers, the photoluminescent layer and the periodic structure in each layer satisfy the condition represented by the formula (15). The positional relationship between the photoluminescent layers and the periodic structures in FIG. 29 may be reversed. Although the layers have different periods in FIG. 29, all the layers may have the same period. In such a case, although the spectrum cannot be broadened, the emission intensity can be increased.

5-7. Structure Including Protective Layer

Figure 30:
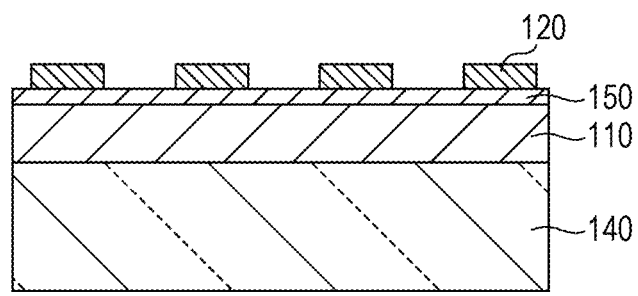
FIG. 30 is a cross-sectional view of a structure including a protective layer between a photoluminescent layer and a periodic structure.

FIG. 30 is a cross-sectional view of a structure including a protective layer 150 between the photoluminescent layer 110 and the periodic structure 120. The protective layer 150 may be provided to protect the photoluminescent layer 110. However, if the protective layer 150 has a lower refractive index than the photoluminescent layer 110, the electric field of light leaks into the protective layer 150 only by about half the wavelength. Thus, if the protective layer 150 is thicker than the wavelength, no light reaches the periodic structure 120. As a result, there is no quasi-guided mode, and the function of emitting light in a particular direction cannot be achieved. If the protective layer 150 has a refractive index higher than or similar to that of the photoluminescent layer 110, light reaches the interior of the protective layer 150; therefore, there is no limitation on the thickness of the protective layer 150. Nevertheless, a thinner protective layer 150 is desirable because more light is emitted if most of the portion in which light is guided (this portion is hereinafter referred to as a "waveguide layer") is formed of a photoluminescent material. The protective layer 150 may be formed of the same material as the periodic structure (light-transmissive layer) 120. In such a case, the light-transmissive layer 120 having the periodic structure functions as a protective layer. The light-transmissive layer 120 desirably has a lower refractive index than the photoluminescent layer 110.

6. Materials

Directional light emission can be achieved if the photoluminescent layer (or waveguide layer) and the periodic structure are formed of materials that satisfy the above conditions. The periodic structure may be formed of any material. However, a photoluminescent layer (or waveguide layer) or a periodic structure formed of a medium with high light absorption is less effective in confining light and therefore results in a lower peak intensity and Q value. Thus, the photoluminescent layer (or waveguide layer) and the periodic structure may be formed of media with relatively low light absorption.

For example, the periodic structure may be formed of a dielectric material having low light absorptivity. Examples of candidate materials for the periodic structure include magnesium fluoride ($MgF_2$), lithium fluoride (LiF), calcium fluoride ($CaF_2$), quartz ($SiO_2$), glasses, resins, magnesium oxide (MgO), indium tin oxide (ITO), titanium oxide ($TiO_2$), silicon nitride (SiN), tantalum pentoxide ($Ta_2O_5$), zirconia ($ZrO_2$), zinc selenide (ZnSe), and zinc sulfide (ZnS). To form a periodic structure having a lower refractive index than the photoluminescent layer, as described above, $MgF_2$, LiF, $CaF_2$, $SiO_2$, glasses, and resins can be used, which have refractive indices of approximately 1.3 to 1.5.

The term "photoluminescent material" encompasses fluorescent materials and phosphorescent materials in a narrow sense, encompasses inorganic materials and organic materials (for example, dyes), and encompasses quantum dots (that is, tiny semiconductor particles). In general, fluorescent materials containing an inorganic host material tend to have a higher refractive index. Examples of fluorescent materials that emit blue light include $M_{10}(PO_4)_6Cl_2:Eu^{2+}$ (wherein M is at least one element selected from Ba, Sr, and Ca), $BaMgAl_{10}O_{17}:Eu^{2+}$, $M_3MgSi_2O_8:Eu^{2+}$ (wherein M is at least one element selected from Ba, Sr, and Ca), and $M_5SiO_4Cl_6:Eu^{2+}$ (wherein M is at least one element selected from Ba, Sr, and Ca). Examples of fluorescent materials that emit green light include $M_2MgSi_2O_7:Eu^{2+}$ (wherein M is at least one element selected from Ba, Sr, and Ca), $SrSi_5AlO_2N_7:Eu^{2+}$, $SrSi_2O_2N_2:Eu^{2+}$, $BaAl_2O_4:Eu^{2+}$, $BaZrSi_3O_9:Eu^{2+}$, $M_2SiO_4:Eu^{2+}$ (wherein M is at least one element selected from Ba, Sr, and Ca), $BaSi_3O_4N_2:Eu^{2+}$, $Ca_8Mg(SiO_4)_4Cl_2:Eu^{2+}$, $Ca_3SiO_4Cl_2:Eu^{2+}$, $CaSi_{12-(m+n)}Al_{(m+n)}O_nN_{16-n}:Ce^{3+}$, and β-SiAlON:$Eu^{2+}$. Examples of fluorescent materials that emit red light include $CaAlSiN_3:Eu^{2+}$, $SrAlSi_4O_7:Eu^{2+}$, $M_2Si_5N_8:Eu^{2+}$ (wherein M is at least one element selected from Ba, Sr, and Ca), $MSiN_2:Eu^{2+}$ (wherein M is at least one element selected from Ba, Sr, and Ca), $MSi_2O_2N_2:Yb^{2+}$ (wherein M is at least one element selected from Sr and Ca), $Y_2O_2S:Eu^{3+},Sm^{3+}$, $La_2O_2S:Eu^{3+},Sm^{3+}$, $CaWO_4:Li^{1+},Eu^{3+},Sm^{3+}$, $M_2SiS_4:Eu^{2+}$ (wherein M is at least one element selected from Ba, Sr, and Ca), and $M_3SiO_5:Eu^{2+}$ (wherein M is at least one element selected from Ba, Sr, and Ca). Examples of fluorescent materials that emit yellow light include $Y_3Al_5O_{12}:Ce^{3+}$, $CaSi_2O_2N_2:Eu^{2+}$, $Ca_3Sc_2Si_3O_{12}:Ce^{3+}$, $CaSc_2O_4:Ce^{3+}$, SiAlON:$Eu^{2+}$, $MSi_2O_2N_2:Eu^{2+}$ (wherein M is at least one element selected from Ba, Sr, and Ca), and $M_7(SiO_3)_6Cl_2:Eu^{2+}$ (wherein M is at least one element selected from Ba, Sr, and Ca).

Examples of quantum dots include materials such as CdS, CdSe, core-shell CdSe/ZnS, and alloy CdSSe/ZnS. Light of various wavelengths can be emitted depending on the material. Examples of matrices for quantum dots include glasses and resins.

The transparent substrate 140, as illustrated in, for example, FIGS. 8C and 8D, is formed of a light-transmissive material having a lower refractive index than the photoluminescent layer 110. Examples of such materials include $MgF_2$, LiF, $CaF_2$, $SiO_2$, glasses, and resins.

8. Production Method

Exemplary production methods will be described below.

Figure 31:
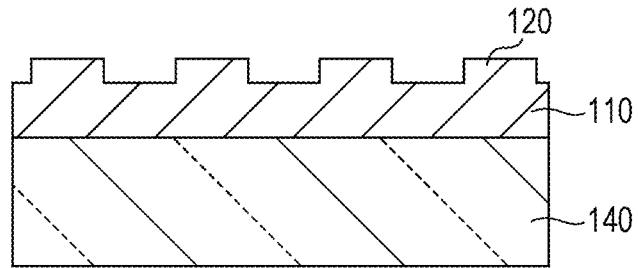
FIG. 31 is a cross-sectional view of a structure including a periodic structure formed by processing only a portion of a photoluminescent layer.

A method for forming the structure illustrated in FIGS. 8C and 8D includes forming a thin film of the photoluminescent layer 110 on the transparent substrate 140, for example, by evaporation, sputtering, or coating of a fluorescent material, forming a dielectric film, and then patterning the dielectric film, for example, by photolithography to form the periodic structure 120. A portion corresponding to the wide-angle light distribution region 40b as illustrated in FIG. 1A is masked to prevent the periodic structure from being formed. Alternatively, the periodic structure 120 may be formed by nanoimprinting. As illustrated in FIG. 31, the periodic structure 120 may also be formed by partially processing the photoluminescent layer 110. In such a case, the periodic structure 120 is formed of the same material as the photoluminescent layer 110.

The light-emitting device 100 illustrated in FIGS. 8A and 8B can be produced, for example, by fabricating the light-emitting device 100a illustrated in FIGS. 8C and 8D and then stripping the photoluminescent layer 110 and the periodic structure 120 from the substrate 140.

The structure illustrated in FIG. 26A can be produced, for example, by forming the periodic structure 120a in a portion corresponding to the narrow-angle light distribution region 40a on the transparent substrate 140 by a process such as a semiconductor process or nanoimprinting and then depositing thereon the material of the photoluminescent layer 110 by evaporation or sputtering. The structure illustrated in FIG. 26B can be produced by filling the recesses in the periodic structure 120a with the photoluminescent layer 110 by coating.

These production methods are for illustrative purposes only, and the light-emitting devices according to the embodiments of the present disclosure may be produced by other methods.

7. Experimental Examples

Light-emitting devices according to embodiments of the present disclosure are illustrated by the following examples.

A sample light-emitting device having the structure as illustrated in FIG. 26A was prepared and evaluated for its properties. The light-emitting device was prepared as described below.

Figure 32:
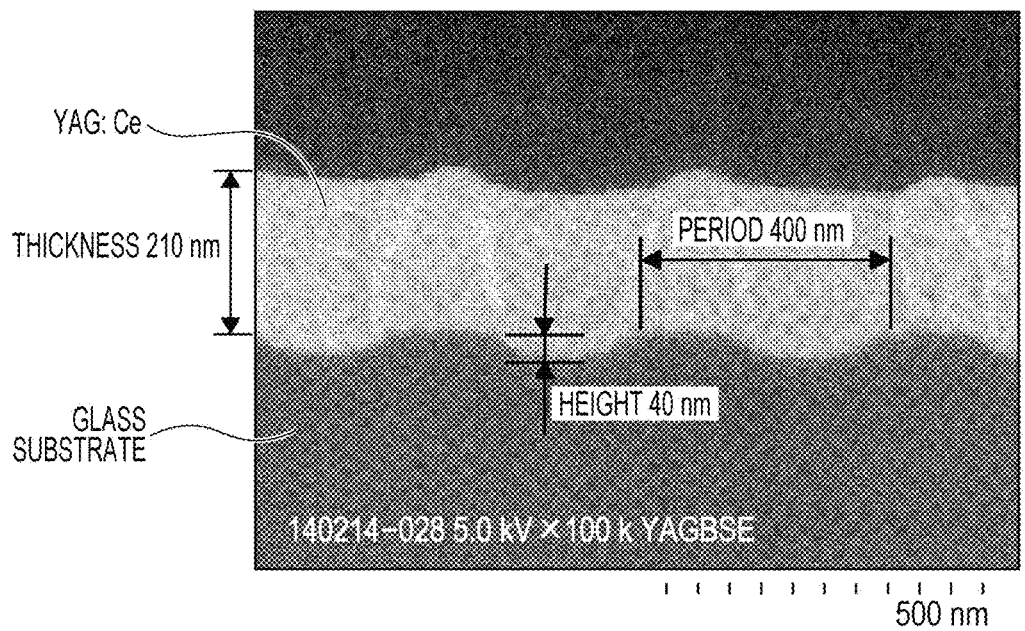
FIG. 32 is a cross-sectional transmission electron microscopy (TEM) image of a photoluminescent layer formed on a glass substrate having a periodic structure.
Figure 33:
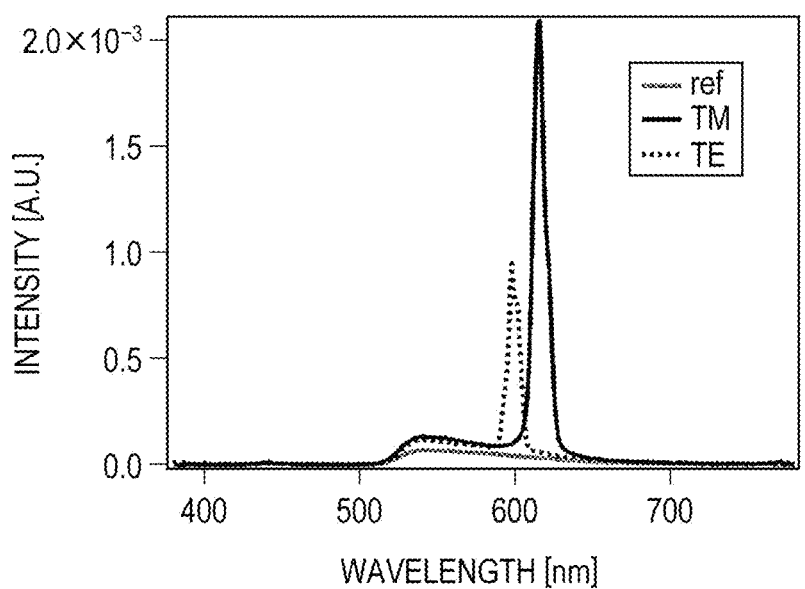
FIG. 33 is a graph showing the measurement results of the spectrum of light emitted from a sample light-emitting device in the front direction.

A one-dimensional periodic structure (stripe-shaped projections) having a period of 400 nm and a height of 40 nm was formed on a glass substrate, and a photoluminescent material YAG:Ce was deposited thereon to a thickness of 210 nm. FIG. 32 shows a cross-sectional transmission electron microscopy (TEM) image of the resulting light-emitting device. FIG. 33 shows the measurement results of the spectrum of light emitted from the light-emitting device in the front direction when YAG:Ce was excited with an LED having an emission wavelength of 450 nm. FIG. 33 shows the results (ref) for a light-emitting device including no periodic structure, the results for the TM mode, and the results for the TE mode. The TM mode has a polarization component parallel to the one-dimensional periodic structure. The TE mode has a polarization component perpendicular to the one-dimensional periodic structure. The results show that the intensity of light of a particular wavelength in the case with the periodic structure is significantly higher than without a periodic structure. The results also show that the light enhancement effect is greater in the TM mode, which has a polarization component parallel to the one-dimensional periodic structure.

Figure 34A:
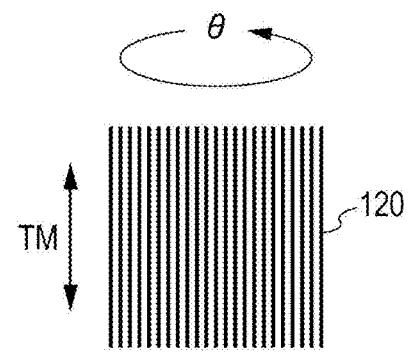
FIG. 34A is a schematic view of a light-emitting device that can emit linearly polarized light in a TM mode, rotated about an axis parallel to the line direction of a one-dimensional periodic structure.
Figure 34B:
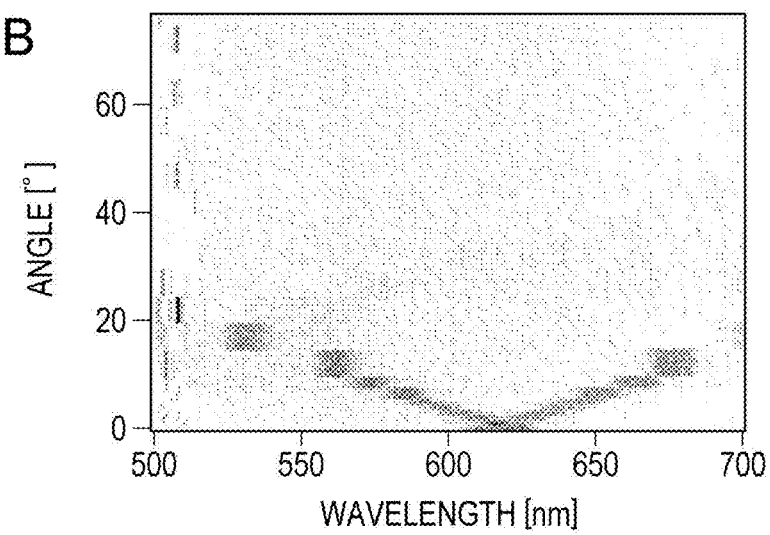
FIG. 34B is a graph showing the measurement results of the angular dependence of light emitted from the light-emitting device rotated as illustrated in FIG. 34A.
Figure 34C:
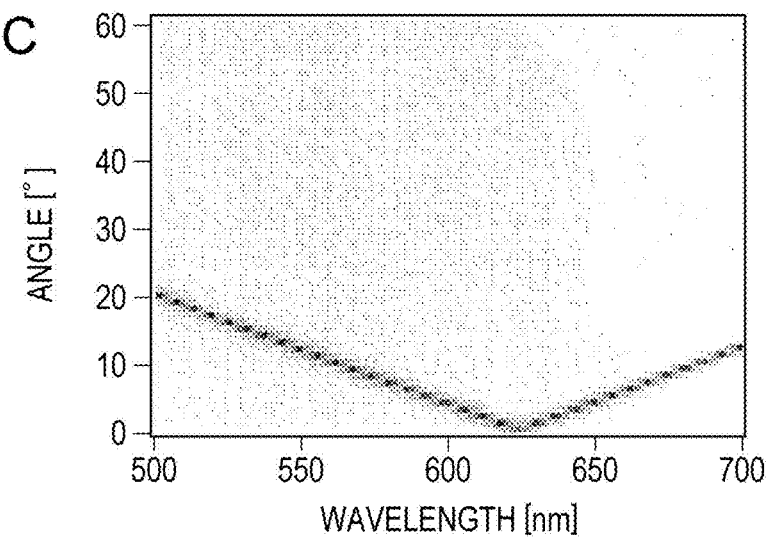
FIG. 34C is a graph showing the calculation results of the angular dependence of light emitted from the light-emitting device rotated as illustrated in FIG. 34A.
Figure 34D:
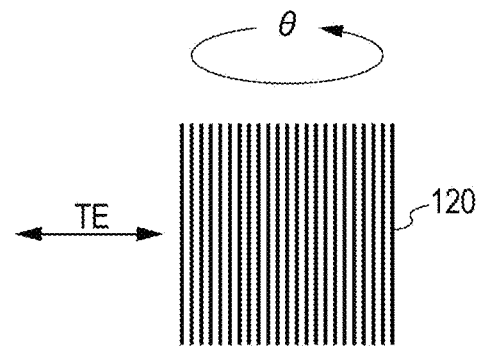
FIG. 34D is a schematic view of a light-emitting device that can emit linearly polarized light in a TE mode, rotated about an axis parallel to the line direction of a one-dimensional periodic structure.
Figure 34E:
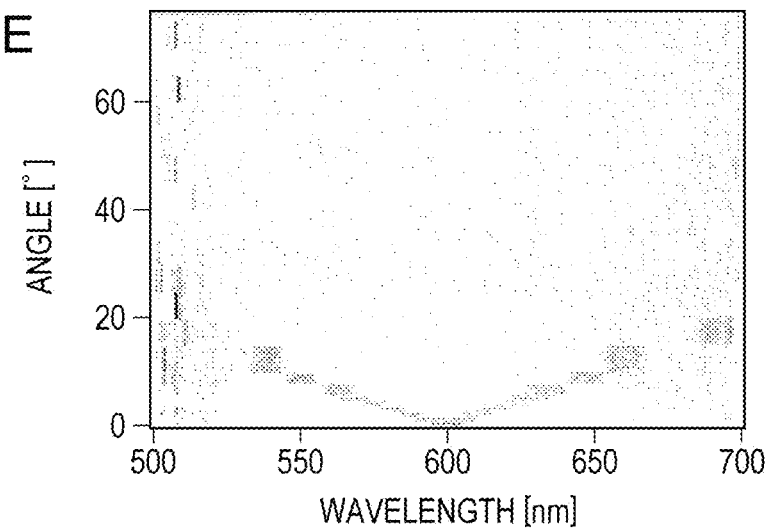
FIG. 34E is a graph showing the measurement results of the angular dependence of light emitted from the light-emitting device rotated as illustrated in FIG. 34D.
Figure 34F:
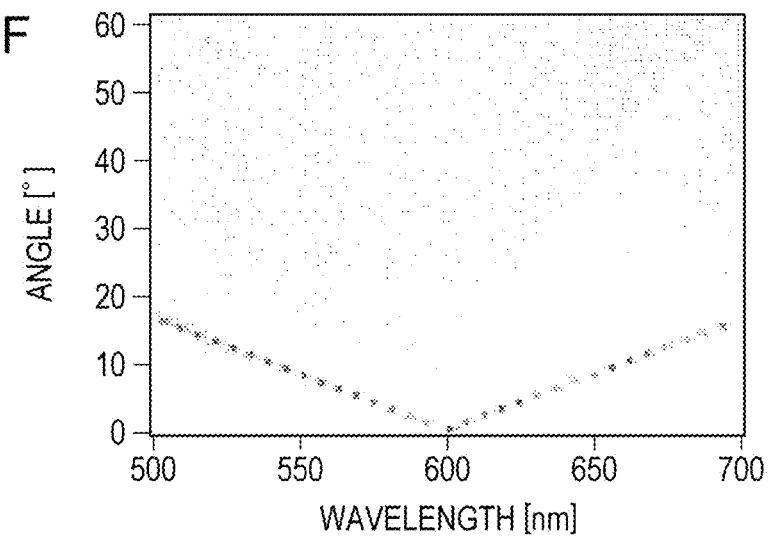
FIG. 34F is a graph showing the calculation results of the angular dependence of light emitted from the light-emitting device rotated as illustrated in FIG. 34D.
Figure 35A:
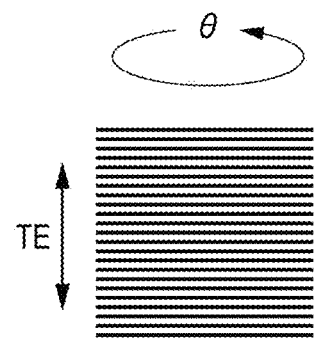
FIG. 35A is a schematic view of a light-emitting device that can emit linearly polarized light in a TE mode, rotated about an axis perpendicular to the line direction of a one-dimensional periodic structure.
Figure 35B:
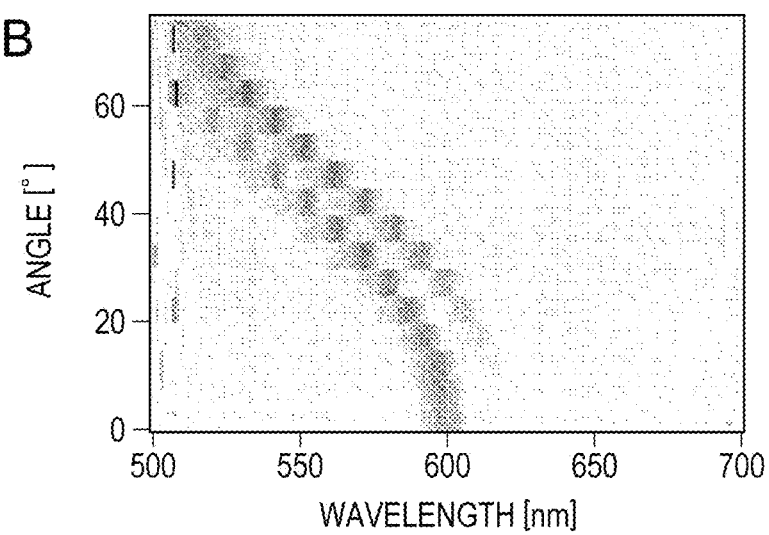
FIG. 35B is a graph showing the measurement results of the angular dependence of light emitted from the light-emitting device rotated as illustrated in FIG. 35A.
Figure 35C:
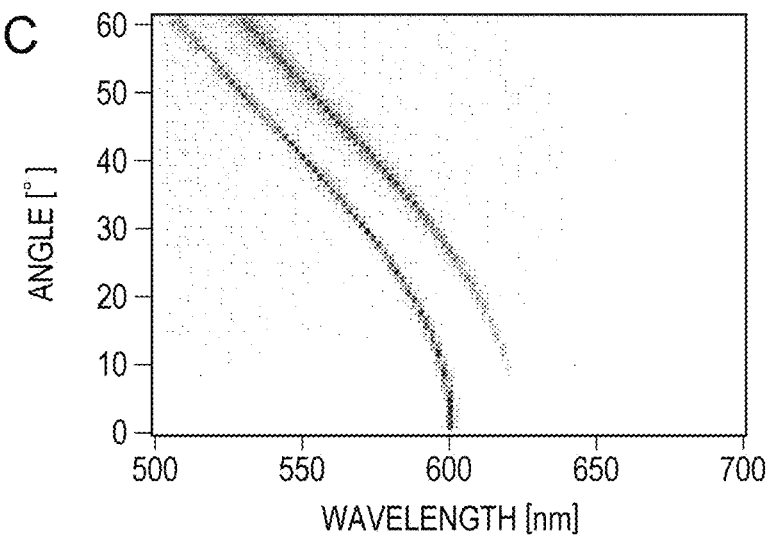
FIG. 35C is a graph showing the calculation results of the angular dependence of light emitted from the light-emitting device rotated as illustrated in FIG. 35A.
Figure 35D:
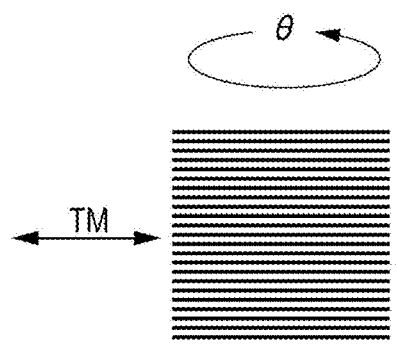
FIG. 35D is a schematic view of a light-emitting device that can emit linearly polarized light in a TM mode, rotated about an axis perpendicular to the line direction of the one-dimensional periodic structure.
Figure 35E:
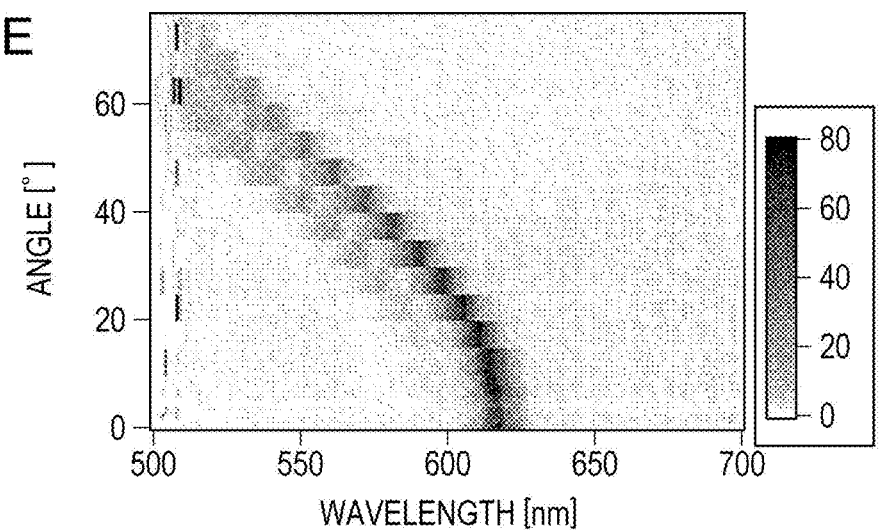
FIG. 35E is a graph showing the measurement results of the angular dependence of light emitted from the light-emitting device rotated as illustrated in FIG. 35D.
Figure 35F:
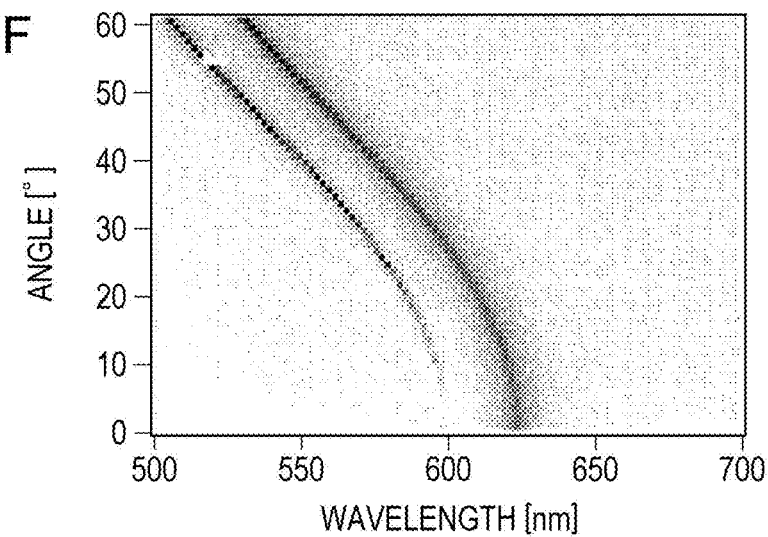
FIG. 35F is a graph showing the calculation results of the angular dependence of light emitted from the light-emitting device rotated as illustrated in FIG. 35D.

FIGS. 34A to 34F and FIGS. 35A to 35F show the results of measurements and calculations of the angular dependence of the intensity of light emitted from the same sample. FIG. 34A illustrates a light-emitting device that can emit linearly polarized light in the TM mode, rotated about an axis parallel to the line direction of the one-dimensional periodic structure (the periodic structure 120). FIGS. 34B and 34C show the results of measurements and calculations for the rotation, respectively. FIG. 34D illustrates a light-emitting device that can emit linearly polarized light in the TE mode, rotated about an axis parallel to the line direction of the one-dimensional periodic structure (the periodic structure 120). FIGS. 34E and 34F show the results of measurements and calculations for the rotation, respectively. FIG. 35A illustrates a light-emitting device that can emit linearly polarized light in the TE mode, rotated about an axis perpendicular to the line direction of the one-dimensional periodic structure (the periodic structure 120). FIGS. 35B and 35C show the results of measurements and calculations for the rotation, respectively. FIG. 35D illustrates a light-emitting device that can emit linearly polarized light in the TM mode, rotated about an axis perpendicular to the line direction of the one-dimensional periodic structure (the periodic structure 120). FIGS. 35E and 35F show the results of measurements and calculations for the rotation, respectively. FIGS. 34A to 34F and FIGS. 35A to 35F show the results for linearly polarized light in the TM mode and the TE mode. FIGS. 34B and 34C show the results for linearly polarized light in the TM mode, and FIGS. 34E and 34F show the results for linearly polarized light in the TE mode. FIGS. 35B and 35C show the results for linearly polarized light in the TE mode, and FIGS. 35E and 35F show the results for linearly polarized light in the TM mode. As is clear from FIGS. 34A to 34F and FIGS. 35A to 35F, the enhancement effect is greater in the TM mode, and the enhanced wavelength shifts with angle. For example, light having a wavelength of 610 nm is observed only in the TM mode and in the front direction, indicating that the light is directional and polarized. Similarity between the results of measurements and calculations experimentally demonstrated the validity of the calculations.

Figure 36:
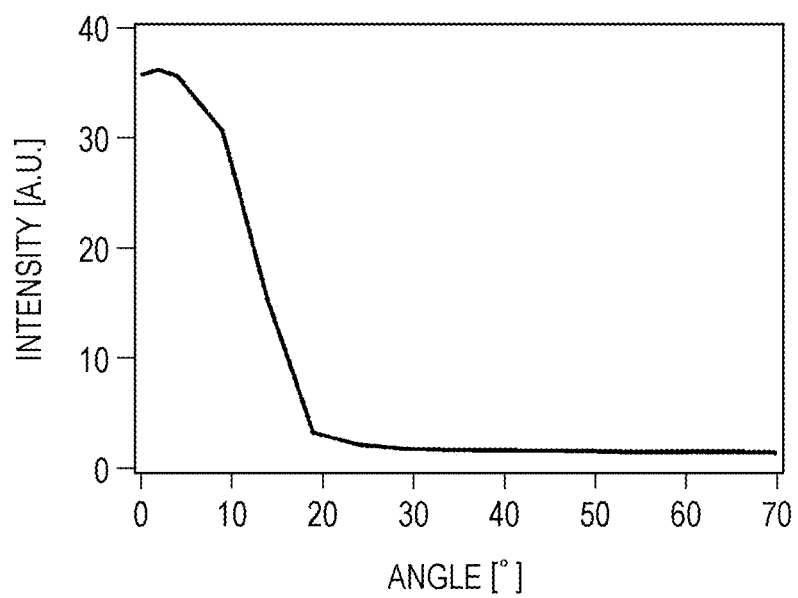
FIG. 36 is a graph showing the measurement results of the angular dependence of light (wavelength: 610 nm) emitted from a sample light-emitting device.

On the basis of the measurement results, the angular dependence of the intensity of light having a wavelength of 610 nm was examined for rotation about an axis perpendicular to the line direction. A graph in FIG. 36 shows the results. The results show that the light was significantly enhanced in the front direction and was little enhanced at other angles. The directional angle (the angle at which light has an intensity of 50% of the maximum intensity) of light emitted in the front direction is less than 15 degrees. Thus, directional light emission was achieved. In addition, all the light was in the TM mode, which demonstrates that polarized light emission was simultaneously achieved.

Although YAG:Ce, which emits light in a wide wavelength range, was used in the above experiment, directional and polarized light emission can also be achieved using a similar structure including a photoluminescent material that emits light in a narrow wavelength range. Such a photoluminescent material does not emit light of other wavelengths and can therefore be used to provide a light source that does not emit light in other directions or in other polarized states.

Light-emitting devices and light-emitting apparatuses according to the present disclosure can be applied to various optical devices, such as lighting fixtures, displays, and projectors.

What is claimed is:

1. A light-emitting apparatus comprising a photoluminescent layer that emits light in response to excitation light and has a light-emitting surface, the light from the photoluminescent layer being emitted through the light-emitting surface,
    wherein the light-emitting surface includes a first region and a second region,
    the light from the photoluminescent layer includes first light having a wavelength $\lambda_a$ in air,
    the first light emitted through the first region has a smaller directional angle than the first light emitted through the second region,
    the photoluminescent layer has a periodic structure in the first region, the periodic structure having projections or recesses or both, and
    a refractive index $n_{wav-a}$ of the photoluminescent layer for the first light and a period $p_a$ of the periodic structure satisfy $\lambda_a/n_{wav-a} < p_a < \lambda_a$.

2. The light-emitting apparatus according to claim 1, wherein
    the photoluminescent layer has a periodic structure having projections or recesses or both in a region opposite the first region on another surface opposite the light-emitting surface, and
    a refractive index $n_{wav-a}$ of the photoluminescent layer for the first light and a period $p_a$ of the periodic structure satisfy $\lambda_a/n_{wav-a} < p_a < \lambda_a$.

3. The light-emitting apparatus according to claim 1, wherein at least part of the second region is disposed at an end of the light-emitting surface.

4. The light-emitting apparatus according to claim 1, wherein the second region surrounds the first region.

5. The light-emitting apparatus according to claim 1, wherein the first region has a larger area than the second region.

6. The light-emitting apparatus according to claim 1, wherein the second region has a larger area than the first region.

7. The light-emitting apparatus according to claim 1, further comprising an excitation light source that emits the excitation light.

8. The light-emitting device according to claim 1, wherein the photoluminescent layer includes a phosphor.

9. The light-emitting device according to claim 1, wherein 380 nm $\leq \lambda_a \leq$ 780 nm is satisfied.

10. The light-emitting device according to claim 1, further comprising a substrate that has refractive index $n_{s-a}$ for the first light and is located on the photoluminescent layer, wherein $\lambda_a/n_{wav-a} < p_a < \lambda_a/n_{s-a}$ is satisfied.

11. A light-emitting apparatus comprising:
    a photoluminescent layer that emits light in response to excitation light; and
    a light transmissive layer that is located on the photoluminescent layer, wherein
    at least one of the photoluminescent layer and the light transmissive layer has a light-emitting surface, the light from the photoluminescent layer being emitted through the light-emitting surface, wherein the light-emitting surface includes a first region and a second region, the light from the photoluminescent layer includes first light having a wavelength $\lambda_a$ in air, the first light emitted through the first region has a smaller directional angle than the first light emitted through the second region, the light-emitting surface is a surface of the light-transmissive layer, the light-transmissive layer has a periodic structure in the first region, the periodic structure having projections or recesses or both, and a refractive index $n_{wav-a}$ of the photoluminescent layer for the first light and a period $p_a$ of the periodic structure satisfy $\lambda_a/n_{wav-a} < p_a < \lambda_a$.

12. The light-emitting apparatus according to claim 11, wherein the photoluminescent layer is in direct contact with the light-transmissive layer.

13. The light-emitting device according to claim 11, wherein the thickness of the photoluminescent layer, the refractive index $n_{wav-a}$ and the period $p_a$ are set to allow an electric field to be formed in the photoluminescent layer, in which antinodes of the electric field are located in or directly below the projections or recesses or both.

14. The light-emitting device according to claim 1, wherein the thickness of the photoluminescent layer, the refractive index $n_{wav-a}$ and the period $p_a$ are set to allow an electric field to be formed in the photoluminescent layer, in which antinodes of the electric field are located in or directly below the projections or recesses or both.

* * * * *